US010580628B2

(12) United States Patent
Berry, III et al.

(10) Patent No.: US 10,580,628 B2
(45) Date of Patent: *Mar. 3, 2020

(54) DIFFERENTIALLY PUMPED REACTIVE GAS INJECTOR

(71) Applicant: Lam Research Corporation, Fremont, CA (US)

(72) Inventors: Ivan L. Berry, III, San Jose, CA (US); Thorsten Lill, Santa Clara, CA (US); Kenneth Reese Reynolds, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 150 days.

This patent is subject to a terminal disclaimer.

(21) Appl. No.: 15/793,506

(22) Filed: Oct. 25, 2017

(65) Prior Publication Data

US 2018/0047548 A1    Feb. 15, 2018

Related U.S. Application Data

(63) Continuation of application No. 14/458,161, filed on Aug. 12, 2014, now Pat. No. 9,837,254.

(51) Int. Cl.
*H01J 37/36* (2006.01)
*H01J 37/32* (2006.01)
*C23F 4/00* (2006.01)

(52) U.S. Cl.
CPC .............. *H01J 37/36* (2013.01); *C23F 4/00* (2013.01); *H01J 37/3244* (2013.01); *H01J 37/32816* (2013.01); *H01J 37/32834* (2013.01)

(58) Field of Classification Search
CPC .............. H01J 37/36; H01J 37/32834; H01J 37/32816; H01J 37/3244; C23F 4/00
(Continued)

(56) References Cited

U.S. PATENT DOCUMENTS 3,704,511 A    12/1972   Hooker
3,899,711 A     8/1975   Lemmond
(Continued)

FOREIGN PATENT DOCUMENTS

CA    1157511    11/1983
CA    1184239     3/1985
(Continued)

OTHER PUBLICATIONS

U.S. Notice of Allowance, dated Jun. 20, 2016, issued in U.S. Appl. No. 14/473,863.
(Continued)

*Primary Examiner* — Rudy Zervigon
(74) *Attorney, Agent, or Firm* — Weaver Austin Villeneuve & Sampson LLP

(57) ABSTRACT

One process used to remove material from a surface is ion etching. In certain cases, ion etching involves delivery of both ions and a reactive gas to a substrate. The disclosed embodiments permit local high pressure delivery of reactive gas to a substrate while maintaining a much lower pressure on portions of the substrate that are outside of the local high pressure delivery area. In many cases, the low pressure is achieved by providing an injection head that confines the high pressure reactant delivery to a small area and vacuums away excess reactants and byproducts as they leave this small area and before they enter the larger substrate processing region. The disclosed injection head may be used to increase throughput while minimizing deleterious collisions between ions and other species present in the substrate processing region. The disclosed injection head may also be used in other types of semiconductor wafer processing.

19 Claims, 15 Drawing Sheets

(58) Field of Classification Search
USPC .................................. 118/715; 156/345.1
See application file for complete search history.

(56) References Cited

U.S. PATENT DOCUMENTS

| | | | |
|---|---|---|---|
| 4,200,794 | A | 4/1980 | Newberry et al. |
| 4,419,580 | A | 12/1983 | Walker et al. |
| 4,873,445 | A | 10/1989 | Le Jeune |
| 5,010,842 | A | 4/1991 | Oda et al. |
| 5,284,544 | A | 2/1994 | Mizutani et al. |
| 5,350,499 | A | 9/1994 | Shibaike et al. |
| 5,811,022 | A | 9/1998 | Savas et al. |
| 6,063,710 | A | 5/2000 | Kadomura et al. |
| 6,110,287 | A * | 8/2000 | Arai .................... C23C 16/5096 156/345.34 |
| 6,153,474 | A | 11/2000 | Ho et al. |
| 6,547,977 | B1 | 4/2003 | Yan et al. |
| 6,579,372 | B2 | 6/2003 | Park |
| 6,617,595 | B1 | 9/2003 | Okunuki |
| 6,821,910 | B2 | 11/2004 | Adomaitis et al. |
| 7,037,846 | B2 | 5/2006 | Srivastava et al. |
| 7,416,989 | B1 | 8/2008 | Liu et al. |
| 7,977,249 | B1 | 7/2011 | Liu et al. |
| 7,981,763 | B1 | 7/2011 | van Schravendijk et al. |
| 8,058,179 | B1 | 11/2011 | Draeger et al. |
| 8,187,486 | B1 | 5/2012 | Liu et al. |
| 8,608,973 | B1 | 12/2013 | Guha |
| 8,617,411 | B2 | 12/2013 | Singh |
| 9,406,535 | B2 | 8/2016 | Berry, III et al. |
| 9,536,748 | B2 | 1/2017 | Berry, III et al. |
| 9,779,955 | B2 | 10/2017 | Lill et al. |
| 9,837,254 | B2 | 12/2017 | Berry, III et al. |
| 9,916,993 | B2 | 3/2018 | Berry, III et al. |
| 2003/0003755 | A1 | 1/2003 | Donohoe |
| 2003/0168588 | A1 | 9/2003 | Brailove et al. |
| 2004/0084410 | A1 | 5/2004 | Lenz |
| 2004/0264044 | A1 | 12/2004 | Konishi et al. |
| 2005/0001527 | A1 * | 1/2005 | Sugiyama .............. C23C 16/505 313/231.31 |
| 2005/0003672 | A1 | 1/2005 | Kools et al. |
| 2005/0032388 | A1 | 2/2005 | Donohoe |
| 2005/0199822 | A1 | 9/2005 | Saini et al. |
| 2005/0211926 | A1 | 9/2005 | Ito et al. |
| 2005/0214478 | A1 | 9/2005 | Hanawa et al. |
| 2005/0218114 | A1 | 10/2005 | Yue et al. |
| 2006/0192104 | A1 | 8/2006 | Schultz et al. |
| 2006/0226120 | A1 | 10/2006 | Rusu et al. |
| 2007/0049018 | A1 | 3/2007 | Sandhu et al. |
| 2007/0063337 | A1 | 3/2007 | Schubert et al. |
| 2007/0068624 | A1 | 3/2007 | Jeon et al. |
| 2007/0181820 | A1 | 8/2007 | Hwang et al. |
| 2008/0132046 | A1 | 6/2008 | Walther |
| 2008/0179186 | A1 | 7/2008 | Shimura et al. |
| 2009/0068849 | A1 | 3/2009 | Endo et al. |
| 2009/0203218 | A1 | 8/2009 | Matsuyama et al. |
| 2010/0178770 | A1 | 7/2010 | Zin |
| 2011/0100954 | A1 | 5/2011 | Satake et al. |
| 2011/0201208 | A1 | 8/2011 | Kawakami et al. |
| 2011/0212625 | A1 * | 9/2011 | Toyoda ................ C23C 16/4412 438/758 |
| 2011/0214814 | A1 * | 9/2011 | Iizuka ...................... C23F 1/08 156/345.34 |
| 2012/0288799 | A1 | 11/2012 | Takase et al. |
| 2013/0216959 | A1 | 8/2013 | Tanaka et al. |
| 2014/0021343 | A1 | 1/2014 | Kirkpatrick et al. |
| 2014/0076716 | A1 | 3/2014 | Gorokhovsky et al. |
| 2014/0083978 | A1 | 3/2014 | Mahadeswaraswamy et al. |
| 2014/0093745 | A1 | 4/2014 | Fan |
| 2014/0227866 | A1 | 8/2014 | Taylor |
| 2014/0356985 | A1 | 12/2014 | Ricci et al. |
| 2015/0179393 | A1 | 6/2015 | Colvin et al. |
| 2015/0287911 | A1 | 10/2015 | Kim et al. |
| 2015/0311292 | A1 | 10/2015 | Srinivasan et al. |
| 2016/0035972 | A1 | 2/2016 | Lee et al. |
| 2016/0049281 | A1 | 2/2016 | Berry, III et al. |
| 2016/0064232 | A1 | 3/2016 | Berry, III et al. |
| 2016/0064260 | A1 | 3/2016 | Berry, III et al. |
| 2016/0111294 | A1 | 4/2016 | Berry, III et al. |
| 2016/0181117 | A1 | 6/2016 | Arghavani et al. |
| 2016/0218015 | A1 | 7/2016 | Oomori et al. |
| 2016/0307781 | A1 | 10/2016 | Berry, III et al. |
| 2016/0308112 | A1 | 10/2016 | Tan et al. |
| 2016/0351407 | A1 | 12/2016 | Sawataishi et al. |
| 2016/0351798 | A1 | 12/2016 | Shen et al. |
| 2016/0379856 | A1 | 12/2016 | Tomura et al. |
| 2017/0047510 | A1 | 2/2017 | Chen et al. |
| 2017/0062181 | A1 | 3/2017 | Berry, III et al. |
| 2017/0148976 | A1 | 5/2017 | Annunziata et al. |
| 2017/0250087 | A1 | 8/2017 | Lill et al. |
| 2017/0372911 | A1 | 12/2017 | Lill et al. |
| 2018/0166304 | A1 | 6/2018 | Berry, III et al. |
| 2018/0286707 | A1 | 10/2018 | Hudson et al. |
| 2019/0131135 | A1 | 5/2019 | Belau et al. |
| 2019/0237298 | A1 | 8/2019 | Berry, III et al. |

FOREIGN PATENT DOCUMENTS

| | | |
|---|---|---|
| CN | 2501657 Y | 7/2002 |
| CN | 1577845 A | 2/2005 |
| CN | 1661762 A | 8/2005 |
| CN | 201544052 U | 8/2010 |
| CN | 102422389 A | 4/2012 |
| CN | 102576667 A | 7/2012 |
| CN | 202291523 U | 7/2012 |
| CN | 103154309 A | 6/2013 |
| CN | 103620730 A | 3/2014 |
| CN | 104282521 A | 1/2015 |
| JP | 06-208837 A | 7/1994 |
| JP | 2003-201957 A | 7/2003 |
| JP | 2005-004068 A | 1/2005 |
| JP | 2009-531535 A | 9/2009 |
| JP | 2011-222960 A | 11/2011 |
| JP | 2012-057251 A | 3/2012 |
| JP | 2013-514633 A | 4/2013 |
| JP | 5432396 | 3/2014 |
| JP | 2011-086966 | 8/2014 |
| KR | 10-2011-0097193 A | 8/2011 |
| TW | 200706849 A | 2/2007 |
| TW | 200926326 A | 6/2009 |
| TW | 2010/09625 A | 3/2010 |
| TW | 2016/19433 A | 6/2016 |
| TW | I671427 B | 9/2019 |
| WO | WO 94/05035 A1 | 3/1994 |
| WO | WO 2007/106076 A2 | 9/2007 |
| WO | WO 2010/120805 A2 | 10/2010 |
| WO | WO 2012/047882 A2 | 4/2012 |
| WO | WO 2013/012620 | 1/2013 |

OTHER PUBLICATIONS

U.S. Office Action, dated Jul. 27, 2017, issued in U.S. Appl. No. 15/191,176.
U.S. Office Action, dated May 8, 2017, issued in U.S. Appl. No. 14/458,161.
U.S. Notice of Allowance, dated Aug. 31, 2017, issued in U.S. Appl. No. 14/458,161.
U.S. Office Action, dated Feb. 17, 2016, issued in U.S. Appl. No. 14/520,070.
U.S. Final Office Action, dated Jun. 28, 2016, issued in U.S. Appl. No. 14/520,070.
U.S. Notice of Allowance, dated Aug. 17, 2016, issued in U.S. Appl. No. 14/520,070.
U.S. Notice of Allowance, dated Nov. 23, 2016, issued in U.S. Appl. No. 14/520,070.
U.S. Office Action, dated Jun. 14, 2016, issued in U.S. Appl. No. 14/592,820.
U.S. Final Office Action, dated Nov. 28, 2016, issued in U.S. Appl. No. 14/592,820.
U.S. Office Action, dated May 11, 2017, issued in U.S. Appl. No. 14/592,820.
U.S. Notice of Allowance, dated Jul. 3, 2017, issued in U.S. Appl. No. 15/054,023.

(56) References Cited

OTHER PUBLICATIONS

U.S. Notice of Allowance [Supplemental Notice of Allowability], dated Jul. 19, 2017, issued in U.S. Appl. No. 15/054,023.
U.S. Notice of Allowability dated Sep. 7, 2017, issued in U.S. Appl. No. 15/054,023.
Chinese First Office Action dated Nov. 2, 2016 issued in Application No. CN 201510548855.2.
Chinese Second Office Action dated Apr. 21, 2017 issued in Application No. CN 201510548855.2.
Engelhardt et al. (1988) "Deep Trench Etching Using CBrF$_3$ and CBrF$_3$/Chlorine Gas Mixtures," *Siemens AG*, Otto-Hahn-Ring, 8000 Munich 83, Germany, pp. 48-54.
Matsuo (May 1, 1980) "Selective etching of Si relative to SiO$_2$ without undercutting by CBrF$_3$ plasma," *Applied Physics Letters*, 36(9):768-770.
Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.
U.S. Appl. No. 15/475,021, filed Mar. 30, 2017, Hudson et al.
U.S. Appl. No. 15/682,369, filed Aug. 21, 2017, Lill et al.
U.S. Notice of Allowance, dated Nov. 16, 2017, issued in U.S. Appl. No. 15/191,176.
U.S. Office Action, dated Jan. 24, 2019, issued in U.S. Appl. No. 15/351,882.
U.S. Notice of Allowance, dated Jul. 10, 2019, issued in U.S. Appl. No. 15/351,882.
U.S. Office Action dated Feb. 5, 2018 issued in U.S. Appl. No. 15/475,021.
U.S. Final Office Action dated Aug. 7, 2018, issued in U.S. Appl. No. 15/475,021.
U.S. Office Action dated Sep. 17, 2019, issued in U.S. Appl. No. 15/798,831.
U.S. Notice of Allowance dated Mar. 26, 2019, issued in U.S. Appl. No. 15/903,865.
Chinese First Office Action dated Dec. 29, 2018 issued in Application No. CN 201710917663.3.
Chinese First Office Action dated Dec. 18, 2018 issued in Application No. CN 201710920105.2.
Chinese Second Office Action dated Aug. 26, 2019 issued in Application No. CN 201710920105.2.
Taiwanese First Office Action dated Feb. 20, 2019 issued in Application No. TW 104128248.
Chinese First Office Action dated Aug. 25, 2017 issued in Application No. CN 201510494523.0.
Chinese Second Office Action dated Apr. 20, 2018 issued in Application No. CN 201510494523.0.
Taiwan First Office Action dated Jan. 17, 2019 issued in Application No. TW 104126021.
Japanese First Office Action dated May 28, 2019 issued in Application No. JP 2015-158951.
Chinese First Office Action dated Aug. 25, 2017 issued in Application No. CN 201510546899.1.
Chinese Second Office Action dated Jun. 20, 2018 issued in Application No. CN 201510546899.1.
Chinese Third Office Action dated Jan. 14, 2019 issued in Application No. CN 201510546899.1.
Taiwanese First Office Action dated May 3, 2019 issued in Application No. TW 104128242.
Chinese First Office Action dated Nov. 27, 2017 issued in Application No. CN 201510684338.8.
Chinese Second Office Action dated Aug. 10, 2018 issued in Application No. CN 201510684338.8.
Taiwan First Office Action dated Mar. 6, 2019 issued in Application No. TW 104134288.
Chinese First Office Action dated Oct. 26, 2018 issued in Application No. CN 201710103518.1.
International Search Report and Written Opinion dated Jun. 29, 2018 issued in Application No. PCT/US18/22239.
Mantzaris et al., "Radio-Frequency Plasmas in CF 4: Self-consistent modeling of the plasma physics and chemistry," J. Appl. Phys., n(12). Jun. 15, 1995, pp. 6169-6180. (used only as evidence). <URL: https://doi.org/10.1063/1.359143.
Taiwan First Office Action dated Oct. 15, 2019 issued in Application No. TW 108120628.
U.S. Office Action, dated Nov. 29, 2019, issued in U.S. Appl. No. 15/880,266.
U.S. Notice of Allowance, dated Nov. 25, 2019, issued in U.S. Appl. No. 14/592,820.
Chinese Second Office Action dated Oct. 8, 2019 issued in Application No. CN 201710917663.3.
International Preliminary Report on Patentability dated Oct. 10, 2019 issued in Application No. PCT/US2018/022239.

\* cited by examiner

DIFFERENTIALLY PUMPED REACTIVE GAS INJECTOR

CROSS-REFERENCE TO RELATED APPLICATION

This application is a continuation of and claims priority to U.S. application Ser. No. 14/458,161, filed Aug. 12, 2014, and titled "DIFFERENTIALLY PUMPED REACTIVE GAS INJECTOR," which is incorporated herein by this reference and for all purposes.

BACKGROUND

Fabrication of semiconductor devices typically involves a series of operations in which various materials are deposited onto and removed from a semiconductor substrate. One technique for material removal is ion beam etching, which involves delivering ions to the surface of a substrate to physically and/or chemically remove atoms and compounds from the surface in an anisotropic manner. The impinging ions strike the substrate surface and remove material through momentum transfer (and through reaction in the case of reactive ion etching).

SUMMARY

Certain embodiments herein relate to methods and apparatus for performing ion beam etching to remove material from the surface of a substrate. In various cases, an injection head may be used to deliver reactants at a local high pressure while maintaining a lower pressure in the greater substrate processing area outside of the injection head. The low pressure may be maintained by applying vacuum pressure in areas surrounding or abutting the local high pressure reactant delivery area of the injection head. This processing scheme allows low pressure ion beam processing with high pressure local reactant delivery, thereby reducing processing times and improving throughput.

In one aspect of the embodiments herein, an apparatus is provided for removing material from a semiconductor substrate. The apparatus may include a reaction chamber; a substrate support for supporting the substrate in the reaction chamber; an ion source configured to deliver ions toward the substrate support; an injection head for providing reactants to a surface of the substrate when the substrate is positioned on the substrate support, the injection head including: a substrate-facing region including (i) a reactant outlet region of a reactant delivery conduit, and (ii) a suction region coupled to a vacuum conduit; and a movement mechanism for moving the injection head with respect to the substrate support.

The reactant delivery conduit may be configured to couple with a line from a reactant source. Similarly, the vacuum conduit may be configured to couple with a line to a vacuum pump. The substrate-facing region of the injection head may include a terminus of the reactant delivery conduit and a terminus of the vacuum conduit, and the termini may be substantially coplanar in some cases. The ion source typically includes a plasma generator for generating a plasma. In various cases the ion source also includes electrodes for extracting ions from the plasma and directing the ions toward the substrate support. In some cases, two electrodes are used. In other cases, three electrodes are used. In certain cases, four or more electrodes are used.

In certain embodiments, the substrate support, injection head, and/or movement mechanism may be configured to maintain a separation distance between the injection head and the surface of the substrate when the substrate is positioned on the substrate support. The separation distance may be about 1 cm or less, for example about 10 mm or less, or about 5 mm or less, or about 2 mm or less, or about 1 mm or less. Other separation distances may be used, as well. The separation distance may be actively controlled through feedback from a distance sensor in some cases.

The suction region typically abuts the reactant outlet region. In some embodiments the suction region surrounds or substantially surrounds the reactant outlet region. A second suction region may be coupled to the vacuum conduit in some cases. The second suction region typically abuts the suction region. In some cases the second suction region surrounds or substantially surrounds the suction region. By using one or more suction regions that abut and/or surround the reactant outlet region, excess reactant gases may be removed from the chamber (through the suction region(s)) before such reactants escape into the larger substrate processing region, where the reactants could undesirably collide with ions in the ion beams.

The reactant outlet region may have a variety of shapes. In some cases the reactant outlet region has a circle or oval shaped cross-section when viewed from above. In other cases, the reactant outlet region has a polygon shaped cross-section when viewed from above. In certain embodiments, the reactant outlet region is long and thin, having a slit shaped cross-section when viewed from above. The length of the reactant outlet region may be smaller than, about equal to or greater than a diameter of a standard substrate to be processed in the apparatus. In particular cases, the length of the reactant outlet region may be at least about equal to or greater than the diameter of a standard semiconductor substrate to be processed in the apparatus. For instance, the standard semiconductor substrate may have a diameter of about 200 mm, about 300 mm, or about 450 mm. This relatively long length is particularly relevant where the injection head is long and thin. The reactant outlet region may have a width in a direction parallel to the substrate support, the width being between about 0.5 mm to 10 cm. The reactant outlet region may be separated from the suction region by a divider having a width between about 0.5 mm and 2 cm, where the width of the divider separates the reactant outlet region from the suction region. In some cases the suction region and/or a second suction region may have a width between about 1 mm and 5 cm.

The apparatus may further include a shutter in some cases. The shutter may be configured to modulate a flux of ions. The shutter may be positioned between the ion source and the substrate support. In a particular case, the shutter may be configured to modulate the flux of ions in a manner that permits certain ions to pass through the shutter while other ions are simultaneously prevented from passing through the shutter, where the ions that are prevented from passing through the shutter are those that would otherwise impact the injection head. In various cases the injection head may further include a housing covering the reactant delivery conduit and the vacuum conduit. The housing may include an ion source-facing surface opposite the substrate-facing region of the injection head, the ion source-facing surface including a sputter-resistant material. In some cases the injection head may be coated on at least an upper surface with a sputter resistant material. The injection head may be configured in some embodiments to locally deliver two or more separate reactants that substantially do not mix with one another before delivery. In some cases a second injection head may be provided for supplying an additional reactant gases.

The apparatus may further include at least one of a sensor, sensor head, detector, or detector head, which may be mounted on, adjacent to, or integrated within the injection head. One or more of the sensors and/or detectors may be configured to monitor at least one of (i) the reactants, (ii) one or more reactant byproducts, and/or (iii) the substrate, within the reactant outlet region. In these or other cases, one or more of the sensors and/or detectors may be configured to monitor at least one of (i) the reactants, (ii) reactant byproducts, and/or (iii) the substrate, within the suction region. Further, in these or other cases, one or more of the sensors and/or detectors may be configured to monitor at least one of (i) the reactants and/or (ii) reactant byproducts, in the vacuum conduit. And in some cases, one or more of the sensors and/or detectors may be configured to monitor at least one of (i) the reactants, (ii) reactant byproducts, and/or (iii) the substrate, proximate the injection head.

The injection head is typically configured to move with respect to the substrate surface. In some cases the apparatus includes a track for moving the injection head over the substrate along an axis. A vacuum compatible X-Y stage may be used for moving the injection head over the substrate in some cases. Further, a rotation mechanism may be configured to rotate the substrate under the injection head. In some embodiments, a vacuum compatible articulating robot arm is used to move the injection head with respect to the substrate.

In some implementations, the injection head may be divided into segments, the segments being configured to receive or experience (i) different reactants, (ii) different reactant flow rates, and/or (iii) different vacuum conductances. One or more of fixed orifices, variable orifices, and/or mass flow controllers may be used for independently controlling the flow rate of reactant or the vacuum conductance supplied or applied to each segment. The segments may be within the reactant outlet region and/or within the suction region in various cases. A heating and/or cooling element may be included in the injection head in certain embodiments. The injection head may be configured to pivot about a point in some implementations. The width of the injection head may be varied to provide uniform gas coverage over the surface of the substrate.

In various embodiments, the apparatus further includes a controller. The controller may have instructions to deliver the reactant to the substrate surface in the reactant outlet region at a first pressure while simultaneously removing the reactant from the suction region. The controller may have instructions to maintain a second pressure in the reaction chamber in areas outside of the reactant outlet region and the suction region, where the second pressure is at least about 25 times lower than the first pressure. In other cases, the second pressure may be at least about 100 times lower than the first pressure, or at least about 500 times lower than the first pressure, or at least about 1000 times lower than the first pressure, or at least about 2000 times lower than the first pressure, or at least about 3000 times lower than the first pressure. The controller may have instructions to move the injection head with respect to the substrate. The instructions to move the injection head with respect to the substrate may achieve substantially uniform ion flux across the surface of the substrate when averaged over time during an etching operation. The instructions to move the injection head with respect to the substrate may include instructions to move the substrate. Alternatively or in addition, the instructions to move the injection head with respect to the substrate may include instructions to move the injection head. The controller may also have instructions to generate a plasma, apply a first bias to an extraction electrode, and apply a second bias to a focus electrode.

In another aspect of the disclosed embodiments, an apparatus for removing material from a semiconductor substrate is provided, the apparatus including: a reaction chamber; a substrate support for supporting the substrate in the reaction chamber; an ion or plasma source configured to deliver ions toward the substrate support; an injection head for providing reactants to a surface of the substrate when the substrate is positioned on the substrate support, the injection head including: (i) a substrate-facing region including a reactant outlet region of a reactant delivery conduit, and (ii) a suction region coupled to a vacuum conduit that is configured to remove excess reactants at a periphery of the substrate; and a movement mechanism for moving the injection head or the substrate support with respect to one another.

In another aspect of the disclosed embodiments, a method of removing material from a semiconductor substrate is provided. The method may include providing the substrate to a reaction chamber; exposing a surface of the substrate to ions emanating from an ion source; exposing the substrate to a reactant gas to thereby allow the reactant gas to contact a surface of the substrate in a reactant outlet area on a first portion of the substrate surface, where the reactant gas is provided to the reactant outlet area at a first pressure, while simultaneously removing the reactant gas in a suction area on the substrate surface and substantially surrounding the reactant outlet area, where the reaction chamber is maintained at a second pressure outside of the reactant outlet area and the suction area, where the second pressure is at least about 25 times lower than the first pressure; and removing the material from the substrate as a result of exposure to the ions and exposure to the reactant gas.

In some cases, the second pressure may be at least about 100 times lower than the first pressure, or at least about 500 times lower than the first pressure, or at least about 1000 times lower than the first pressure, or at least about 2000 times lower than the first pressure, or at least about 3000 times lower than the first pressure. In certain cases the second pressure is about 10 mTorr or less, for example about 1 mTorr or less.

The method may also include moving the reactant outlet area over the substrate surface. The reactant outlet area may be moved over the substrate surface in a manner that delivers the reactants in a spatially uniform manner when averaged over time. In other cases, the reactant outlet area is moved over the substrate in a manner that delivers reactants in a spatially non-uniform manner when averaged over time. Moving the reactant outlet area over the substrate surface may include rotating the substrate. In these or other cases, moving the reactant outlet area over the substrate surface may include scanning the reactant outlet area over the substrate surface. In various implementations, exposing the substrate to the reactant gas includes: delivering the reactant gas to an injection head including a substrate-facing region including: (i) a reactant outlet region of a reactant delivery conduit, where the reactant outlet region delivers reactants to the reactant outlet area, and (ii) a suction region coupled to a vacuum conduit, where the suction region removes reactants in the suction area. A distance between a lower surface of the injection head and the surface of the substrate may be maintained between about 0.1-5 mm while the injection head delivers the reactant gas. A small separation distance helps minimize escape of the reactants into the greater substrate processing region, where such reactant molecules can collide with the ion beams.

Various types of ions may be used as desired. In some cases, the ions are inert or non-reactive. In other cases the ions are reactive. For instance, in some cases the ions oxidize material on the substrate. The reactant gas may react with the oxidized material on the substrate to thereby remove the oxidized material. In certain embodiments the reactant gas may include one or more gases selected from the group consisting of oxidizers, halogenators, reducing agents, complexing agents, acids, bases, alcohols, ketones, aldehides, or esters or any combination thereof. Examples include but are not limited to: $H_2O$, $H_2O_2$, $NO_2$, $NO$, $N_2O$, $CF_4$, $C_2F_6$, $CHF_3$, $SF_6$, $HF$, $HCl$, $HI$, $HNO_3$, $Cl_2$, $CClF_3$, $CCl_2F_2$, $HBr$, $Br_2$, $F_2$, $H_2$, $NH_3$, methanol, ethanol, isopropanol, acetic acid, formic acid, carboxylic acid, acetone, methylethyl ketone, acetyl acetone (acac), hydrofluoro acetone (hfac), formaldehyde, and butyl acetate.

Exposing the substrate to ions may include, in various implementations, generating a plasma, extracting the ions from the plasma by applying a first bias to an extraction electrode positioned between the plasma and the substrate, and focusing the ions by applying a second bias to a focus electrode positioned between the extraction electrode and the substrate. Removing material from the substrate typically includes removing at least a portion of a layer of material on the substrate. The layer of material may form a feature of a non-volatile memory device. The non-volatile memory device may be an MRAM device. The non-volatile memory device may be an FeRAM device. The non-volatile memory device may be a PCM device. The non-volatile memory device may be a 3D stacked memory device.

In certain embodiments, reactant pressure and/or reactant flow are modulated to result in a uniform material removal rate over the surface of the substrate when averaged over time. In other embodiments, reactant pressure or reactant flow is modulated to result in a non-uniform material removal rate over the surface of the substrate when averaged over time. Different reactant pressures or different reactant flow rates may be maintained within different segments in the injection head to result in uniform material removal over the substrate surface when averaged over time. In other cases, different reactant pressures or different reactant flow rates may be maintained within different segments in the injection head to result in non-uniform material removal over the substrate surface when averaged over time.

These and other features will be described below with reference to the associated drawings.

DETAILED DESCRIPTION

Figure 1:
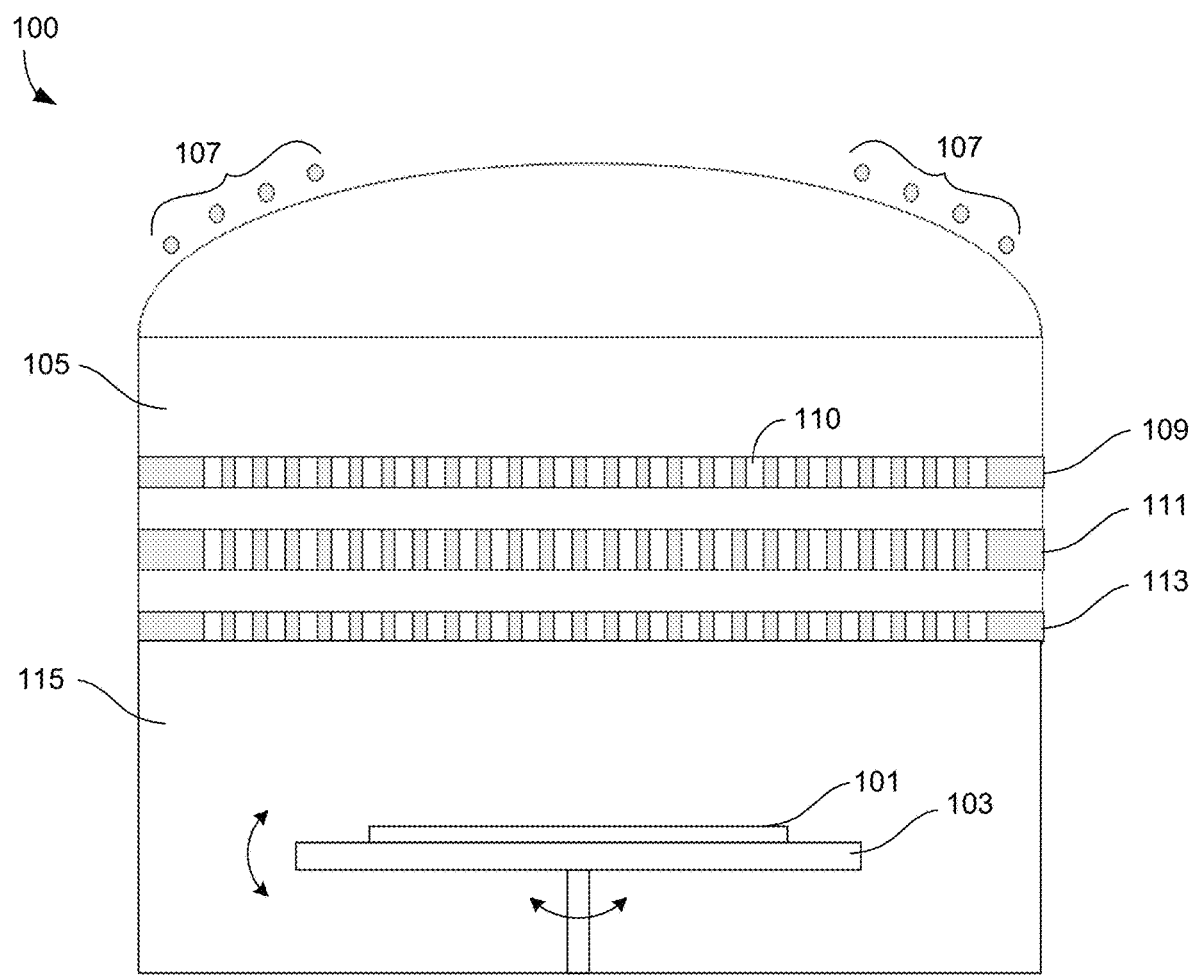
FIG. 1 presents a simplified view of a reaction chamber that may be used for performing ion beam etching.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, flat panel displays, semiconductor packages, magnetic recording media and devices, optical devices, mirrors and other reflecting media, sheet metal or other materials that are substantially planar, and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Ion beam etching is commonly used in fabrication of semiconductor devices. As mentioned above, ion beam etching involves removing material from the surface of a substrate by delivering energetic ions to the substrate surface. Ion beam etching may be broadly categorized into processes that solely involve inert ions (e.g., argon ions), and processes that involve reactive ions or chemical reactions initiated by ions (e.g., oxygen ions, certain ionized compounds such as fluorine-containing ionized compounds, reactive or inert ions initiating a chemical reaction with a reactant that is chemisorbed or physisorbed on the surface on the substrate). In both types of processes, ions impinge on the substrate surface and remove material through either direct physical momentum transfer (sputtering) or a chemical reaction initiated by the energy transfer from the ions (Reactive Ion Beam Etching). Reactive ion beam etching typically involves either utilization of an ion that in addition to a physical impact can chemically react with the substrate (such as oxygen, fluorine and the like) or an inert ion that initiates a chemical reaction between the substrate and a reactant (such as an applied gas that is adsorbed on the surface) or an ion that generates a reactive site on the surface of the substrate that reacts with an applied reactant coincident with or subsequent to the generation of the reactant site, or any combination of thereof.

Certain applications for ion beam etching processes relate to etching of non-volatile materials. In some cases, the material etched is a conductive material. In certain embodiments, the material is etched in the context of forming a magneto-resistive random-access memory (MRAM) device, a spin-torque-transfer memory device (STT-RAM), a phase-change memory device (PSM), a non-volatile conductor (copper, platinum, gold, and the like). In other applications, the ability to control the ion incident angle to the substrate can be useful in generating 3D devices such as vertically stacked memory, FinFET devices or gate-all-around structures.

When performing ion beam etching processes, it is desirable to promote a highly uniform ion flux over the substrate surface. A high degree of uniformity is beneficial in creating reliable devices across the entire surface of the substrate. Further, it may be desirable in certain cases to promote a high ion flux and/or a high flux of a gas phase reactant. High flux can help maximize throughput. Another factor that affects the quality of the etching results is the ability to control the energy and angle at which the ions impact the surface. These factors are important in forming features having desired dimensions and profiles.

FIG. 1 presents a simplified cross-sectional view of an apparatus 100 for performing ion beam etching according to certain methods. In this example, substrate 101 rests on substrate support 103, which may be equipped with hardware (not shown) to provide electrical and fluidic connections. The electrical connections may be used to supply electricity to the substrate support 103 in some cases, while the fluidic connections may be used to provide fluids used to control the temperature of the substrate 101 and substrate support 103. The substrate support 103 may be heated by a heater (not shown) or cooled by a cooling mechanism (not shown). The cooling mechanism may involve flowing cooling fluids through piping in or adjacent the substrate support 103. In some cases a heater may heat the substrate to an elevated temperature that is at least about 100° C., for example at least about 200° C., at least about 300° C., or at least about 400° C. In these or other cases, the heater may heat the substrate to a temperature of about 600° C. or less. Where a cooling mechanism is used, the cooling mechanism may cool the substrate to a temperature between about room temperature to −100° C. The substrate support 103 may be capable of rotating and tilting at variable speeds and angles, as indicated by the double headed arrows in FIG. 1.

A plasma generation gas is delivered to a primary plasma generation region 105. The plasma generation gas is energized by a plasma source 107. In the context of FIG. 1, the plasma source 107 is a coil that acts as an inductively coupled plasma source. Other sources such as capacitively coupled sources, microwave sources or arc discharge sources, liquid metal ion sources or field ionization sources may be employed in appropriately designed reactors. Plasma forms in the primary plasma generation region 105. An extraction electrode 109 contains a series of apertures 110 through which ions are extracted. The bias $V_1$ applied to the extraction electrode 109 acts to provide kinetic energy to the ion with respect to the substrate. This bias is generally positive and can range between about 20-10,000 volts or more, and in certain cases ranges between 25-2,000 volts. Positive ions in the plasma above the extraction electrode 109 are attracted to the lower electrode 113 by the potential difference between electrodes 109 and 113. Focus electrode 111 is added to focus the ions, and if needed, repel electrons. A bias $V_2$ on the focus electrode 111 can be either positive or negative with respect to the extraction electrode 109, and in various cases is biased negatively. The bias potential of focus electrode 111 is determined by the lensing characteristics of the focus electrode 111. Voltages on this electrode range from positive voltages above potential $V_1$ (e.g., between about 1.5× to 10× the bias $V_1$), to negative voltages (e.g., between about −0.001× to −0.9× the bias $V_1$). Due to the different potentials applied to the different electrodes, a potential gradient exists. The potential gradient may be on the order of about 1000 V/cm. Example separation distances between neighboring electrodes fall between about 0.1-10 cm, or for example about 1 cm. After the ions leave the bottom of the grounded lower electrode 113, they travel in a collimated and focused beam.

The lower electrode 113 is grounded in many (but not all) cases. The use of a grounded lower electrode 113 in combination with a grounded substrate 101 results in a substrate processing region 115 that is substantially field-free. Having the substrate located in a field-free region prevents electrons or secondary ions generated by collisions of the ion beam with residual gases or with surfaces in the reaction chamber from being accelerated towards the substrate, which could otherwise cause unwanted damage or secondary reactions. Additionally it is important to prevent the substrate 101 from charging from the ion beam itself, or from ejected secondary electrons generated during the ion beam collision with the substrate. Neutralization is typically accomplished by adding a low energy electron source (not shown) in the vicinity of the substrate 101. Since the positive charge on the ion, and the ejected secondary electrons both charge the substrate positively, low energy electrons in the vicinity can be attracted to the positively charged surface and can neutralize this charge. Performing this neutralization is much easier in a field free region.

In some applications it may be desirable to have a potential difference between the lower electrode 113 and substrate 101. For example, if very low energy ions are required, it is difficult to maintain a well collimated beam at low energy over long distances due to mutual repulsion of the positively charged ions (space-charge effects). One solution to this is to place a negative bias on the lower electrode 113 with respect to substrate 101 (or conversely biasing substrate 101 positively with respect to the lower electrode 113). This bias scheme involves extraction of the ions at higher energy and then slowing the ions as they approach the substrate.

The apertures 110 in the extraction electrode 109, focus electrode 111 and lower electrode 113 may be precisely aligned with one another. Otherwise, ions will be aimed incorrectly, and the on-wafer etching results will be poor. For instance, if a single aperture in the focus electrode 111 is misaligned, it may result in one area of the substrate 101 becoming over-etched (where too many ions are directed) and another area of the substrate 101 becoming under-etched (where no ions or too few ions are directed). As such, it is desirable for the apertures to be aligned with one another as much as possible. In various cases the misalignment between vertically adjacent electrodes is limited to about 1% or less of the hole diameter (as measured by the distance of a linear shift in the position of the aperture as compared to the adjacent aperture).

Ion beam etching processes are typically run at low pressures. In some embodiments, the pressure may be about 100 mTorr or less, for example about 10 mTorr or less, or about 1 mTorr or less, and in many cases about 0.1 mTorr or less. The low pressure helps minimize undesirable collisions between ions and any gaseous species present in the substrate processing region.

Unfortunately, the low pressure required in many reactive ion beam etching applications limits the rate at which reactants can be delivered to the substrate processing region. If reactants are delivered at a rate that is too high, the pressure will rise and ion-gas collisions become problematic. The low reactant flow rate results in a relatively low throughput process, because the chemical reactant/etchant is not present at a sufficient partial pressure to effectively etch the surface in a rapid manner.

Certain embodiments disclosed herein address this collision-throughput tradeoff by providing reactant gases to the surface of the substrate at a relatively high local pressure with an injection head while maintaining a relatively low pressure outside the injection head. In operation, the injection head may provide a large pressure gradient between a reactant delivery region of the injection head and the edge of the injection head. The injection head delivers reactants and simultaneously vacuums away the excess reactant species and byproducts. This setup prevents most of the reactant gas load from entering the region where such reactants are likely to collide with ions, and therefore enables both lower pressure in the overall substrate processing region and higher pressure local reactant delivery. The injection head may be scanned over different parts of the wafer in such a manner to uniformly deliver reactant gas to the substrate surface over time. Although at any given time the scanned injection head is only supplying reactants at high pressures to a local portion of the wafer, the injection head scans over the surface of the substrate during the etching process such that, on average, the reactant gas is delivered in a uniform manner. Various scanning patterns may be used to provide uniform reactant delivery. Alternatively the injector head may cover the entire substrate, and may be alternately positioned over the substrate, then removed from the substrate.

Figure 2A:
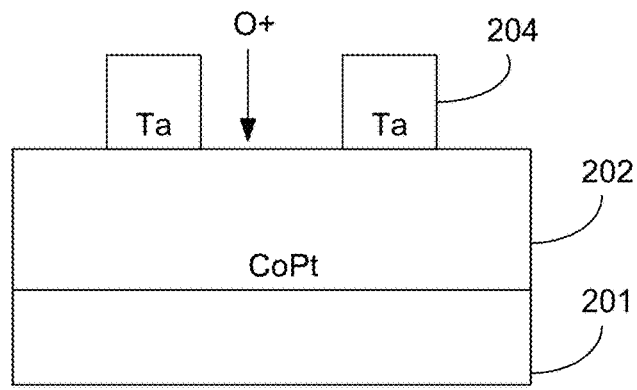
FIGS. 2A-2C depict a substrate as it undergoes an ion beam etching process according to one embodiment.
Figure 2B:
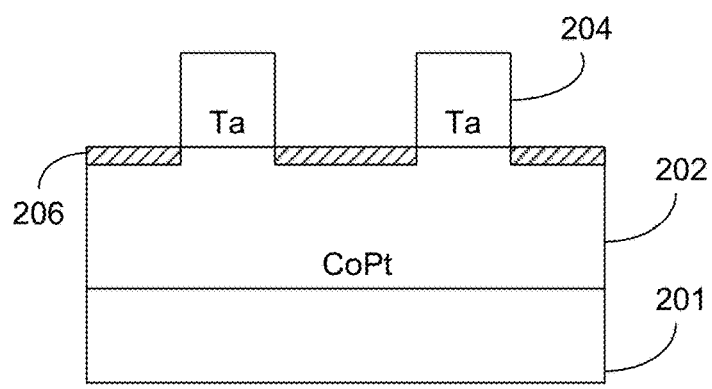
Figure 2C:
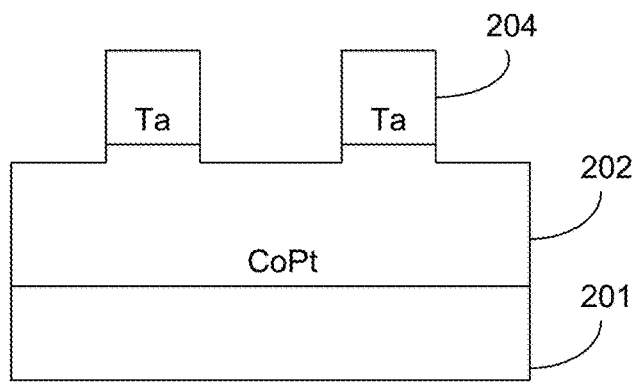

One example process where the disclosed injection head may be beneficial involves etching a substrate as shown in FIGS. 2A-2C. FIG. 2A shows the substrate during an initial portion of the etching process. The substrate has an underlying layer or layers 201, along with a partially exposed layer of cobalt platinum (CoPt) 202, with a patterned hard mask layer 204 thereon. In this example the hard mask layer is tantalum. Although these materials are provided as examples, the disclosed embodiments may be used to etch any of various materials that are etchable by a sequential combination of an ion beam and an applied reactant. Example materials to be etched include but are not limited to: (1) semiconductors such as silicon, silicon-germanium, germanium, which in some cases may be etched by a sequence of $Cl_2$, HCl, HBr, or $Br_2$ gas exposure followed by inert ion exposure (the inert ions may be, for example, He, Ne, Ar, Kr, Xe, or a combination thereof); (2) metals such as Cu, Fe, Co, Ni, Pd, or W, which may in some cases be oxidized with an oxygen ion beam, then reacted with an acid or an organic vapor such as acetyl acetone (acac), hydrofluoro acetone (hfac), or acetic acid or formic acid to form a volatile gas or high vapor pressure compound; (3) metals or semiconductors such as Si, SiGe, Ge, groups III-V elements, Pd, and Fe, which in some cases may be surface activated by an inert or reactive ion such as H, He, O, N, F, Cl, or Br ions, then chemically etched at the reactive site by application of a reactant gas or vapor such as $F_2$, HF, $Cl_2$, HCl, $Br_2$, HBr, $NH_3$, acetic acid, combinations thereof, etc.

A plasma is generated in the primary plasma generation region above the set of electrodes. The gas used to generate the plasma in this example includes oxygen, and the generated plasma therefore includes oxygen ions. The oxygen ions travel through the extraction electrode, focus electrode, and lower electrode, and impact the surface of the substrate as shown in FIG. 2A. After the ions impact the substrate surface for a period of time, an upper surface of the cobalt platinum material 202 becomes oxidized material 206, as shown in FIG. 2B. The hard mask layer 204 may resist oxidation. After exposure to the reactant gas, the oxidized material 206 is etched away, as shown in FIG. 2C.

In conventional methods, this etching may involve extinguishing the plasma, transferring the substrate to another processing chamber, and contacting the substrate with oxide removal chemistry such as acetyl acetone (acac), hydrofluoro acetone (hfac), or acetic acid. Other substrate materials may be removed by other compounds. In some cases, the removal occurs through wet chemistry methods.

Figure 3:
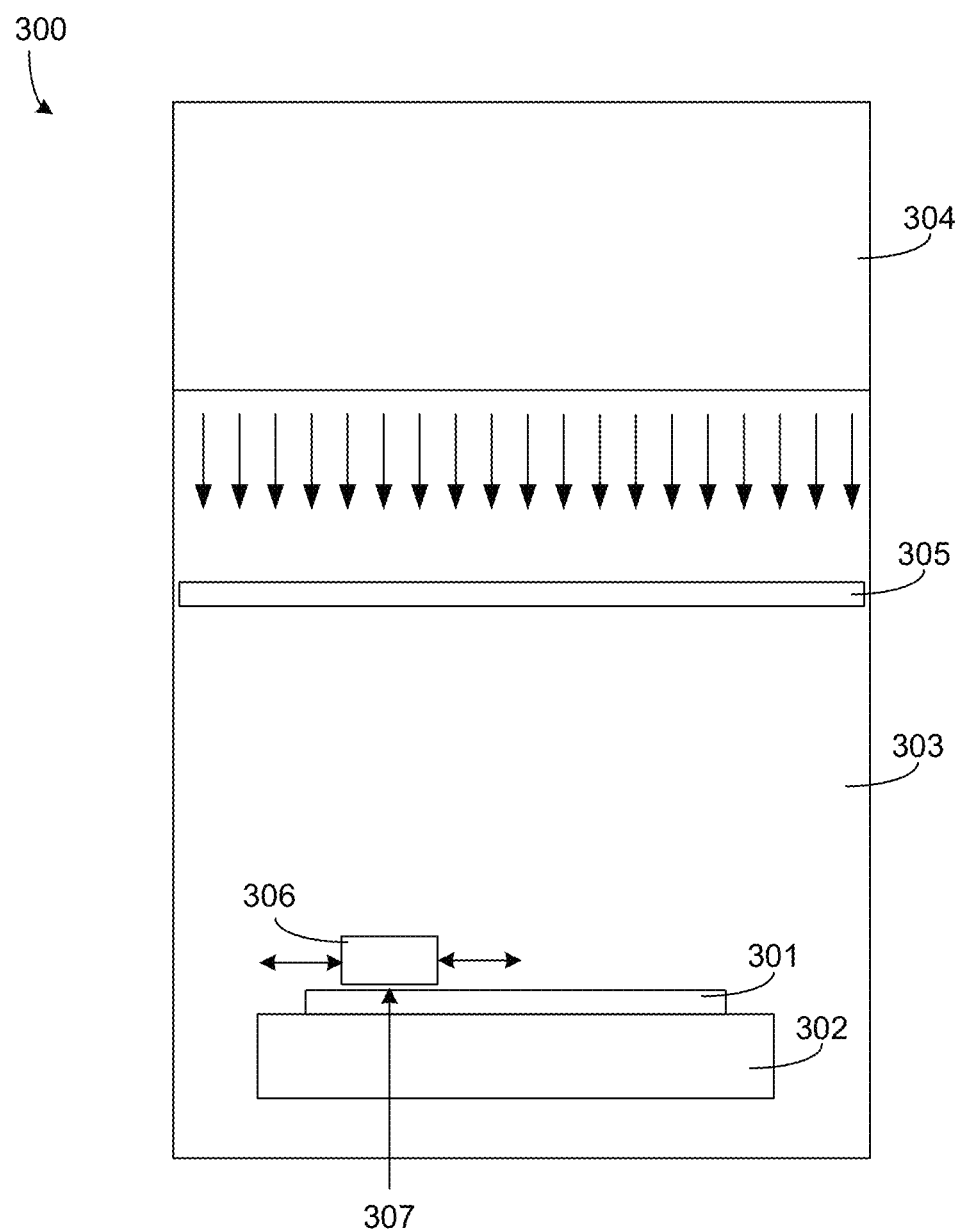
FIG. 3 presents a reaction chamber having an injection head for delivering reactants at a local high pressure.

In the disclosed embodiments, however, the extra steps such as extinguishing the plasma and transferring the substrate to a new processing chamber may be avoided. In one example, the injection head scans the surface of the wafer to deliver reactant gases or vapors at relatively high local partial pressures (e.g., a partial pressure that is at least about 10×, or at least about 100×, or at least about 500×, or at least about 1000×, or at least about 2000×, and in some cases at least about 3000× the pressure in the substrate processing region) while the plasma is present in the primary plasma generation region and ions are actively impacting the substrate surface. The reactant gas etches the oxidized material from the surface. In another example, the injection head scans the surface of the wafer to deliver reactant gas at certain times while ions are not actively impacting the surface. In one such example, the flow of ions into the substrate processing region is modulated with a shutter, as shown in FIG. 3. In this way, the plasma can remain ignited and the flow of ions can be shuttered on and off as needed. The injection head may move to a location that is out of the way (i.e., not between the wafer and the electrodes) while the shutter is open and ions are impinging on the substrate surface.

In some cases, the shutter may be configured to block ions passing through a certain portion of the electrodes while allowing ions to pass through other portions of the electrode. Rather than acting like blinds that all open and close together, the shutter in this case may independently block or unblock individual apertures in the electrodes. In this way, the flow of ions through each aperture may be turned on and off. One advantage of this embodiment is that an aperture may be shuttered off only when an injection head is directly between that particular aperture and the substrate surface, while the aperture remains open during times when the injection head is not in the way.

Regardless of whether the injection head actively delivers reactant gas to the substrate while ions are impinging on the substrate, the use of the injection head allows for both parts of etching (ion delivery and chemical reactant delivery) to occur in the same chamber, without extinguishing the plasma.

For applications such as atomic layer etching (ALE), the disclosed embodiments are particularly useful, as they allow each portion of the process to be pressure optimized. ALE involves sequential delivery and adsorption of reactants, purging of excess reactants, and exposure to an energy source to remove very thin layers (e.g., monolayers in some cases) of material. Often, such adsorption, purging and energy exposure operations are performed in a cyclic manner to etch material on a layer-by-layer basis. The disclosed injection head and methods of use substantially open the available operating window for the pressure at which various gases are provided. Further, the disclosed techniques may result in ALE methods that use different timing sequences. For instance, reactant delivery, purging, and exposure to energy may all occur simultaneously on different portions of the wafer. Reactant delivery and purging occur locally under the injection head, and exposure to energy (ions) occurs globally everywhere that the injection head doesn't block. Atomic layer etching methods are further discussed in the following U.S. patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

FIG. 3 presents a simplified view of a reaction chamber 300 used for reactive ion beam etching in some implementations. A wafer 301 is supported on a pedestal such as an electrostatic chuck 302 in substrate processing region 303. Ions are generated, extracted, and focused in the ion source 304. The ion source 304 may include a plasma generation region and a series of electrodes as shown in FIG. 1, though other ion sources may also be used. The flow of ions emanating from the ion source 304 may be shuttered on and off through optional ion shutter 305. The injection head 306 moves over the surface of the substrate 301 to deliver process gases under the injection head 306 at the local high pressure delivery region 307. The local high pressure region may also be referred to as a reactant outlet region or reactant delivery region. The local high pressure region may form part of a reactant delivery conduit, and may be coupled to a line that provides reactants to the injection head 306.

Low pressure is maintained in the substrate processing region 303 by the injection head 306, which removes the local high pressure reactants immediately after they are delivered to the wafer 301. In particular, while the reactants are delivered in the local high pressure delivery region 307, the injection head 306 simultaneously applies a vacuum to the regions surrounding or otherwise proximate to the local high pressure delivery region 307 (these surrounding regions are sometimes referred to as pressure drop regions or suction regions), thereby removing excess reactants before they enter the larger substrate processing region 303 outside of the injection head 306. The excess reactants are removed through vacuum connection (not shown). The vacuum connection may be somewhat thin and flexible to allow the injection head 306 to move over the surface of the wafer 301, or it may form a part of the injection head itself. The vacuum connection may be physically joined with the lines used to deliver reactants such that the reactant delivery lines and the vacuum connection move together (though they remain functionally separated).

In some cases the injection head may be elongated to extend the entire width of the substrate, and the vacuum connection may be configured in-line with the head. FIG. 3 may be interpreted in this way, with the injection head 306 (as well as the reactant delivery line and vacuum connection, which may form part of the injection head 306) extending into and out of the page. In this embodiment, the injection head may deliver reactants to the entire surface of the wafer by scanning along a single axis perpendicular to the length of the injector head (i.e., left and right in FIG. 3) or along a pivot point. In this configuration the vacuum connection would not block the ion beam in regions outside of the injection head itself. Further details of the injection head 306 are discussed below.

Figure 4A:
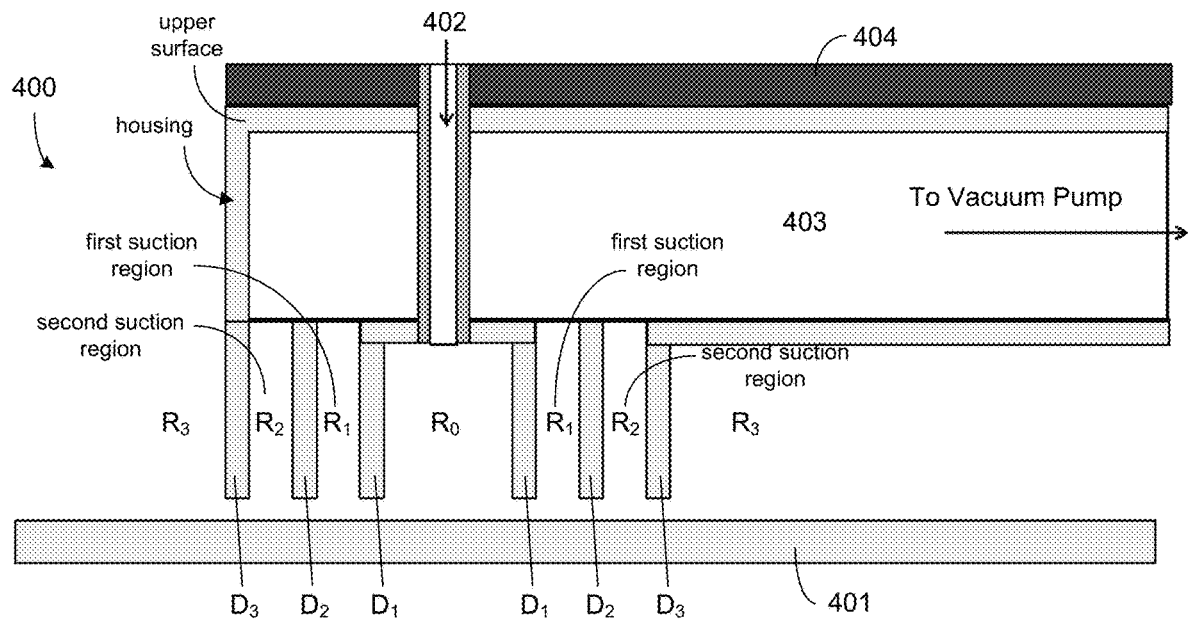
FIGS. 4A-4C depict a cross-sectional view of an injection head according to certain embodiments.
Figure 4B:
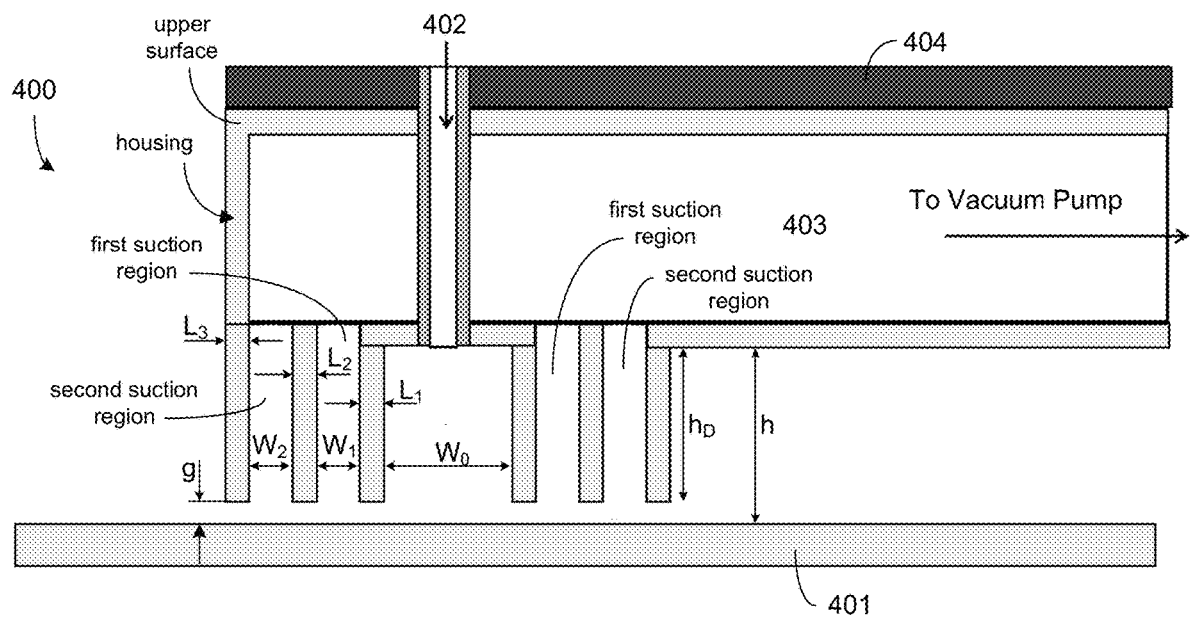
Figure 4C:
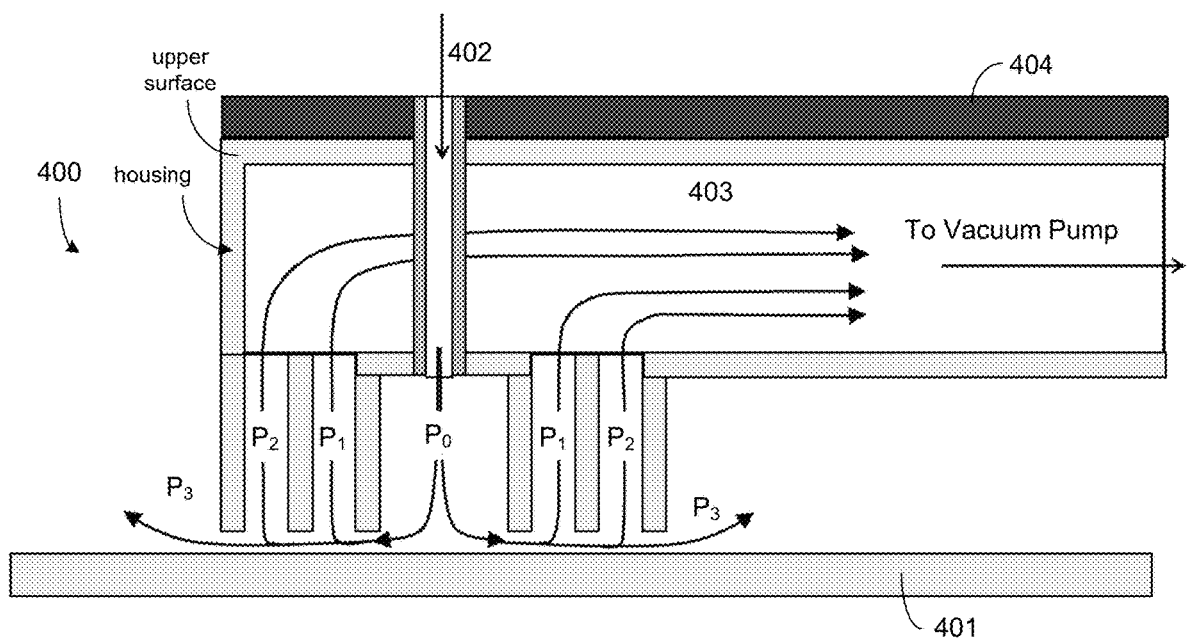

FIGS. 4A-4C present simplified cross-sectional views of an injection head 400 passing over a wafer 401 according to certain embodiments. FIG. 4A shows the injection head 400 and the components therein. FIG. 4B is provided to illustrate certain dimensions of the injection head 400. FIG. 4C is provided to illustrate flow patterns through the injection head 400. Beginning with FIG. 4A, reactant gases are introduced to the injection head 400 at reactant inlet 402. The reactant gases are introduced to the local high pressure region $R_0$ (also referred to as a reactant outlet region) at a relatively high pressure. A first divider $D_1$ separates the local high pressure region $R_0$ from the first pressure drop region $R_1$ (also referred to as a suction region), a second divider $D_2$ separates the first pressure drop region $R_1$ from the second pressure drop region $R_2$ (sometimes referred to as a second suction region), and a third divider $D_3$ separates the second pressure drop region $R_2$ from the surrounding substrate processing region $R_3$. The dividers may be sheets or other thin structures, and may be made of an etchant-resistant material such as a polymer, ceramic, metal, or glass. Example materials include aluminum, aluminum alloys, anodized aluminum, stainless steel, alumina ceramic, machinable glass ceramic, fused silica, inconel, monel, boro-silicate glass, vespel, Teflon or kapton, which may be chosen for the particular etchant(s) being used.

Vacuum is applied to the first and second pressure drop regions $R_1$ and $R_2$ in order to vacuum away excess reactant delivered to the local high pressure region $R_0$. The vacuum is applied through vacuum connection 403. In a similar embodiment, the vacuum connection 403 extends into and out of the page, rather than extending off to the right as shown in FIGS. 4A-4C. In one embodiment the local high pressure region $R_0$ may be a cylindrically shaped region bounded on the sides by the first divider $D_1$. The first and second pressure drop regions $R_1$ and $R_2$ may be annularly shaped to surround the local high pressure region $R_0$. Alternatively, each of the local high pressure region $R_0$ and the first and second pressure drop regions $R_1$ and $R_2$ may be long and thin when viewed from above (e.g., each having a substantially rectangular cross-section as viewed from above), each extending into/out of the page.

A sputter resistant coating 404 may coat the injection head 400. Such a sputter resistant coating 404 may be made from carbon (e.g., amorphous carbon), or a material that, if sputtered, would not be considered a contaminate of the substrate material such as silicon, $SiO_2$, aluminum, or $Al_2O_3$, etc. The sputter resistant coating 404 may help minimize the amount of material that is sputtered off of the injection head 400. The injection head outer shell (under the sputter-resistant coating) may be made from a polymer, ceramic, metal, or glass, with examples including aluminum, aluminum alloys, anodized aluminum, stainless steel, alumina ceramic, machinable glass ceramic, fused silica, inconel, monel, boro-silicate glass, vespel, Teflon or kapton.

Another way to characterize the different relevant regions is by looking at what is happening on the wafer itself. The portion of the wafer located under the local high pressure region $R_0$ may be referred to as a local high pressure area (also referred to as the reactant outlet area). The portion of the wafer located under the pressure drop regions $R_1$ and $R_2$ may be referred to as a pressure drop area, or two pressure drop sub-areas. These areas may also be referred to as suction areas. The portion of the wafer that's not under the injection head may be referred to as the ion processing areas. The positions of the local high pressure area, the pressure drop area and the ion processing area change as the injection head moves over the surface of the wafer.

Those of ordinary skill in the art understand that any of a variety of shapes may be used in a structure or structures for creating the local high pressure region $R_0$ and the first and second pressure drop regions $R_1$ and $R_2$, so long as the pressure drop regions are designed or configured to vacuum away excess reactants and reactant byproducts after they are delivered to the local high pressure region $R_0$ and before they enter the substrate processing region $R_3$. As such, the first pressure drop region $R_1$ may surround or substantially surround the local high pressure region $R_0$, and the second pressure drop region $R_2$ may surround or substantially surround the first pressure drop region $R_1$. The regions may be round/cylindrical as shown in FIGS. 4A-4C, or they may be another shape (oval, square, rectangular, triangular, other polygonal shape, slit, etc.). The exposed area under $R_0$ may substantially smaller than the substrate, approximately equal to the substrate, or larger than the substrate. In a particular example the local high pressure region is shaped as a relatively long and thin slit, and the pressure drop region abuts both sides of the slit. In this case, while the pressure drop region may or may not entirely surround the local high pressure region (e.g., near the thin sides of the slit), such a pressure drop region may be said to substantially surround the local high pressure region because a substantial majority of the excess reactants are vacuumed away by the pressure drop regions proximate the long sides of the slit-shaped local high pressure region. In certain embodiments, one or both pressure drop regions surround at least about 70% (or at least about 90%) of the perimeter of the reactant delivery region. In a particular case one or both pressure drop regions surround 100% of the perimeter of the reactant delivery region. In certain embodiments, the first pressure drop/suction region is directly adjacent to the local high pressure/reactant delivery region. In certain embodiments, the second pressure drop/suction region is directly adjacent the first pressure drop/suction region.

Any number of separate pressure drop/suction regions may be used. While two pressure drop regions are shown in FIGS. 4A-4C, in some embodiments only a single pressure drop region is used. In other embodiments, two or more pressure drop regions are used, for example three or more pressure drop regions. In some embodiments, up to about 5 pressure drop regions are used. The substrate processing region and the local high pressure region are not considered to be pressure drop regions. Typically, any pressure drop region will be located proximate a local high pressure region or another pressure drop region, and will have a vacuum connection for removing excess reactants. The pressure drop regions act to sequentially reduce the pressure between adjacent regions.

FIG. 4B presents the injection head 400 illustrated in FIG. 4A, with certain dimensions highlighted. $W_0$ represents the width of the local high pressure region $R_0$. $W_1$ and $W_2$ represent the thickness (outer diameter minus inner diameter, where these regions are annularly shaped) of the first pressure drop region $R_1$ and the second pressure drop region $R_2$, respectively. $L_1$, $L_2$, and $L_3$ represent the thicknesses of the first divider $D_1$, second divider $D_2$, and third divider $D_3$, respectively. The distance between the surface of the substrate 401 and the bottom of the dividers $D_1$-$D_3$ is marked g. The distance between the surface of the substrate 401 and the vacuum connection 403 is marked h. The height of the dividers is marked $h_D$.

The width $W_0$ may be between about 0.5 mm to 10 cm. The thickness $W_1$ may be between about 1 mm to 5 cm. Similarly, the thickness $W_2$ may be between about 1 mm to 5 cm. The $W_1$ and $W_2$ thicknesses may be the same or different. In some cases, $W_1$ is larger than $W_2$, while in other cases $W_2$ is larger than $W_1$. The thickness $L_1$ may be between about 0.5 mm to 2 cm. Similarly, the thickness $L_2$ may be between about 0.5 mm to 2 cm, and the thickness $L_3$ may be between about 0.5 mm to 2 cm. In some cases, $L_1$, $L_2$, and $L_3$ are substantially the same (e.g., they do not differ by more than about 5%). In other cases, these thicknesses may be different. The height g between the bottom of the dividers $D_1$-$D_3$ and the surface of the substrate 401 may be about 5 mm or less, for example about 2 mm or less, or about 1 mm or less. In some cases this distance g is between about 0.1 mm to 5 mm–. This distance should be relatively small to minimize the amount of excess reactant that escapes from the injection head and into the substrate processing region. The height h may be between about 0 to 5 cm In some cases, the dividers $D_1$-$D_3$ have unequal length, and the distance between the bottom of each divider and the surface of the substrate is different. Although not shown in FIG. 4B, in such an embodiment the distance between the substrate surface and the first divider $D_1$ may be referred to as $g_1$, the distance between the substrate surface and the second divider $D_2$ may be referred to as $g_2$, and the distance between the substrate surface and the third divider $D_3$ may be referred to as $g_3$. It may be desirable in certain embodiments that $g_1$ is largest and/or $g_3$ is smallest (when comparing $g_1$, $g_2$, and $g_3$). In this way, escape of excess reactants to the substrate processing region $R_3$ may be minimized. By adjusting divider length, $D_1$-$D_3$, divider widths $L_1$-$L_3$, and divider gaps $W_0$-$W_2$, reactant gas residence times can be adjusted.

FIG. 4C illustrates flow patterns through the injection head 400. Also noted in FIG. 4C is the pressure experienced at each region. A pressure of $P_0$ is present in the local high pressure region $R_0$, a pressure of $P_1$ is present in the first pressure drop region $R_1$, a pressure of $P_2$ is present in the second pressure drop region $R_2$, and a pressure of $P_3$ is present in the substrate processing region $R_3$. $P_0$ is the highest pressure and $P_3$ is the lowest pressure. Reactants are delivered to the high pressure region $R_0$ at pressure $P_0$, where they act on the substrate surface to etch away material. Excess reactants and reaction products then pass under the first divider $D_1$ and into the first pressure drop region $R_1$ where they are vacuumed away by the vacuum connection 403. Species that are not vacuumed up in the first pressure drop region $R_1$ instead pass under the second divider $D_2$ and into the second pressure drop region $R_2$ where they are vacuumed away by the vacuum connection 403. A very small amount of species may pass under the third divider $D_3$ and into the substrate processing region $R_3$. However, the amount of such species that escape to the substrate processing region $R_3$ is quite small, and does not generally pose a problem in terms of ion collisions. In certain embodiments, $P_0$ may be at least about 1000 times higher than $P_3$. In one example, $P_0$ is at least about 10 times higher than $P_1$, which is at least about 10 times higher than $P_2$, which is at least about 10 times higher than $P_3$. In these and other cases, the pressure may drop by a factor of at least 5 between adjacent regions.

In certain embodiments, the injection head covers a fraction of the substrate's surface area of between about 0.1% and 50%, or between about 1% and 10%. This fraction may represent the portion of the substrate blocked from ion contact and/or the portion of the substrate exposed to the reactant delivery portion and suction portion(s) of the injection head. In other embodiments, the injection head covers 100% or more of the substrate.

Figure 4D:
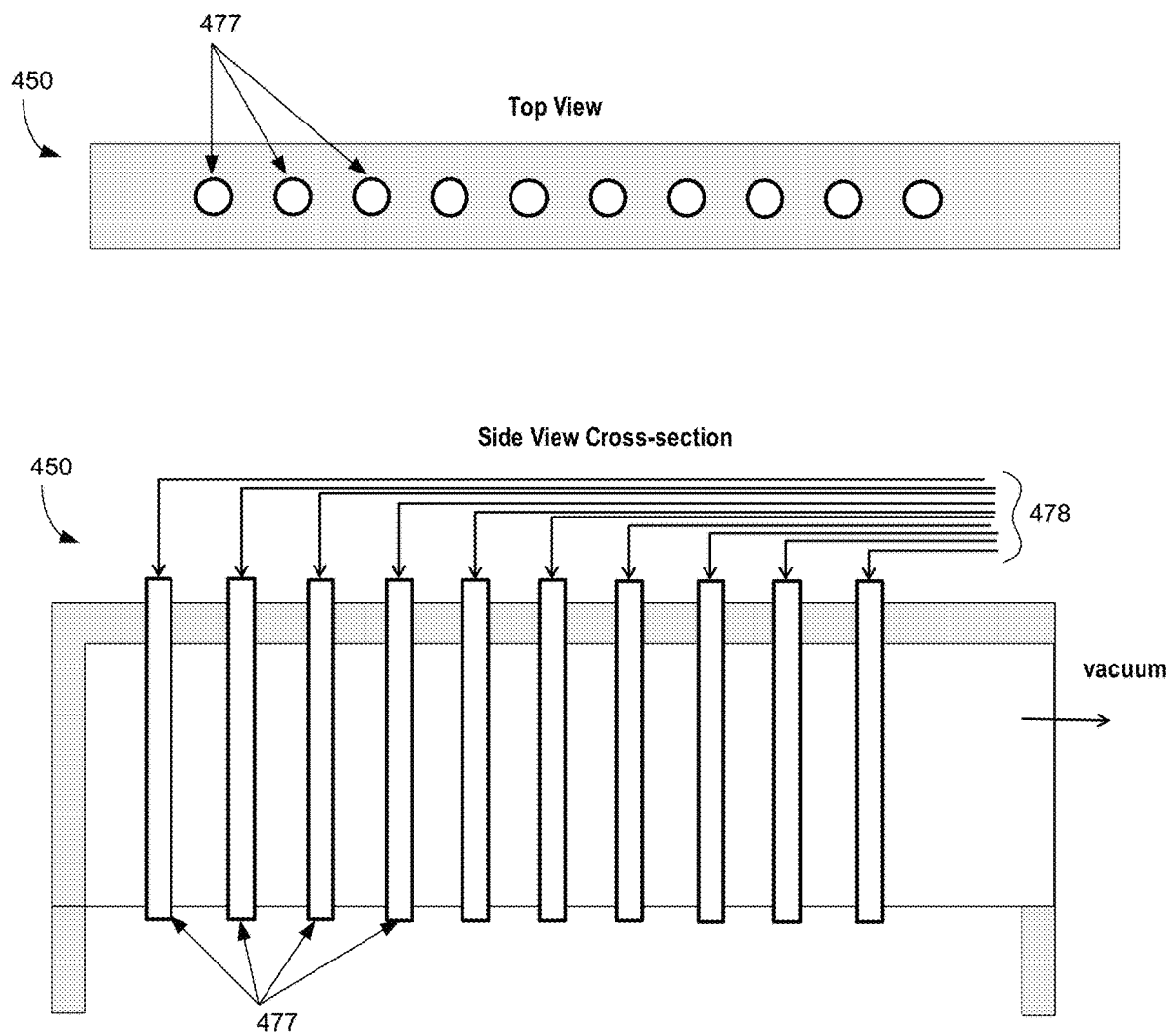
FIG. 4D illustrates a top down view and a side cross-sectional view of an injection head having numerous independently controllable gas delivery conduits.
Figure 4E:
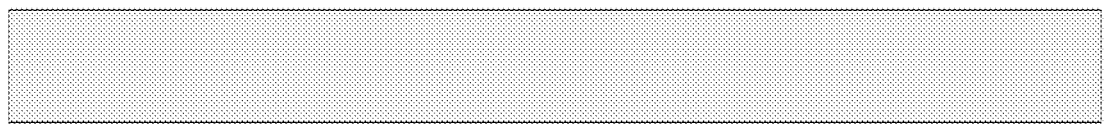
FIG. 4E presents a top down view and a side cross-sectional view of an injection head having numerous independently controllable vacuum segments.
Figure 4E:
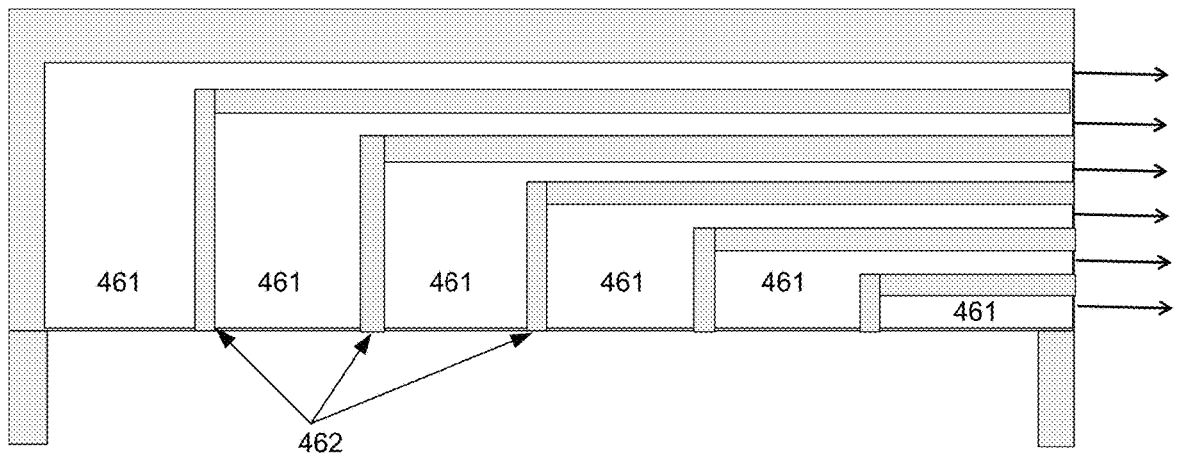
Figure 4F:
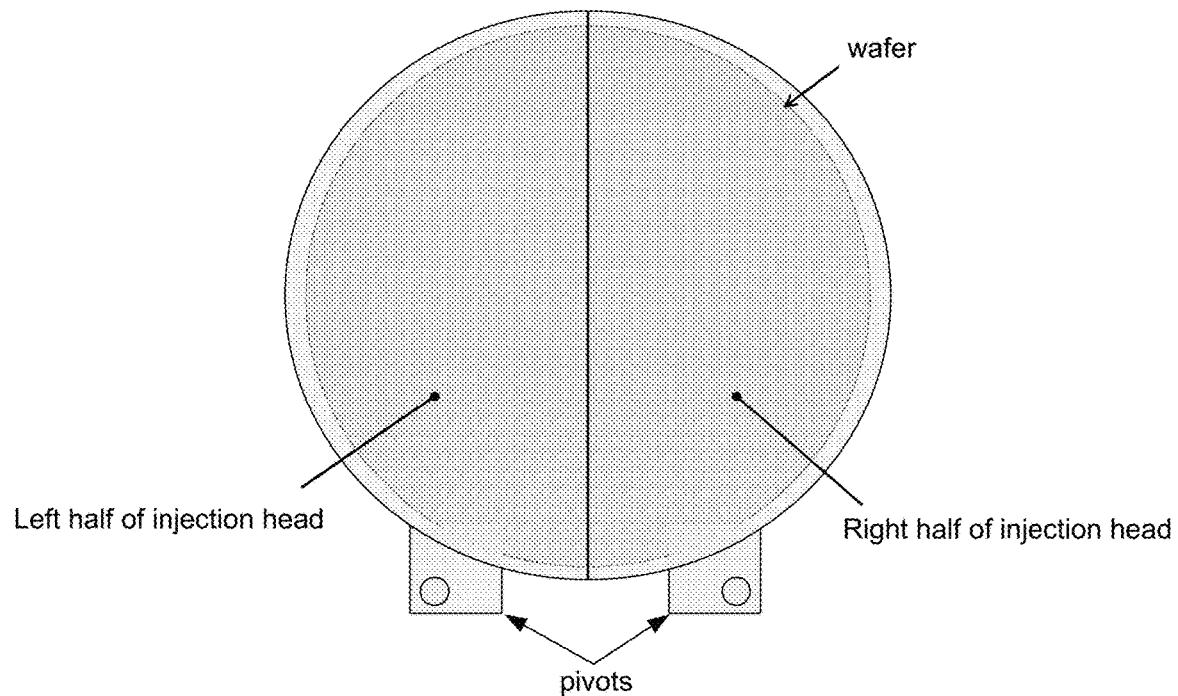
FIG. 4F presents a top down view and a cross-sectional view of an injection head that covers the full area of the substrate.
Figure 4G:
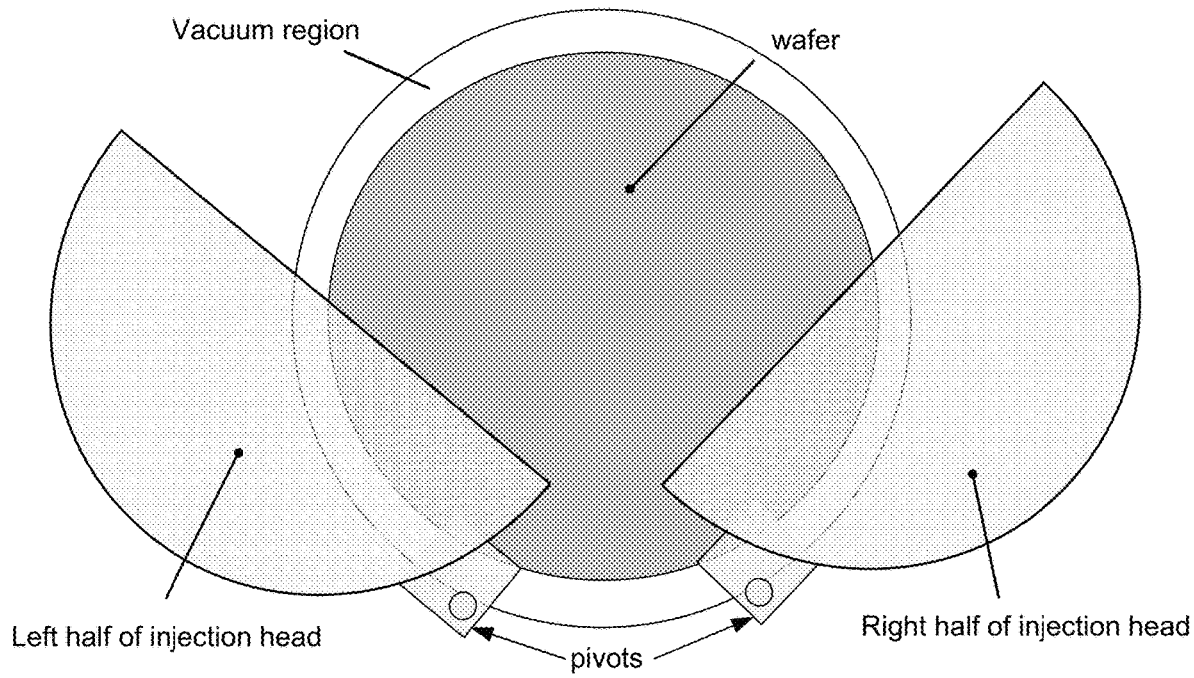
FIG. 4G presents a top down view of an injection head that is that is separable into two halves and is opened by pivoting the halves, shown in a half opened position.
Figure 4H:
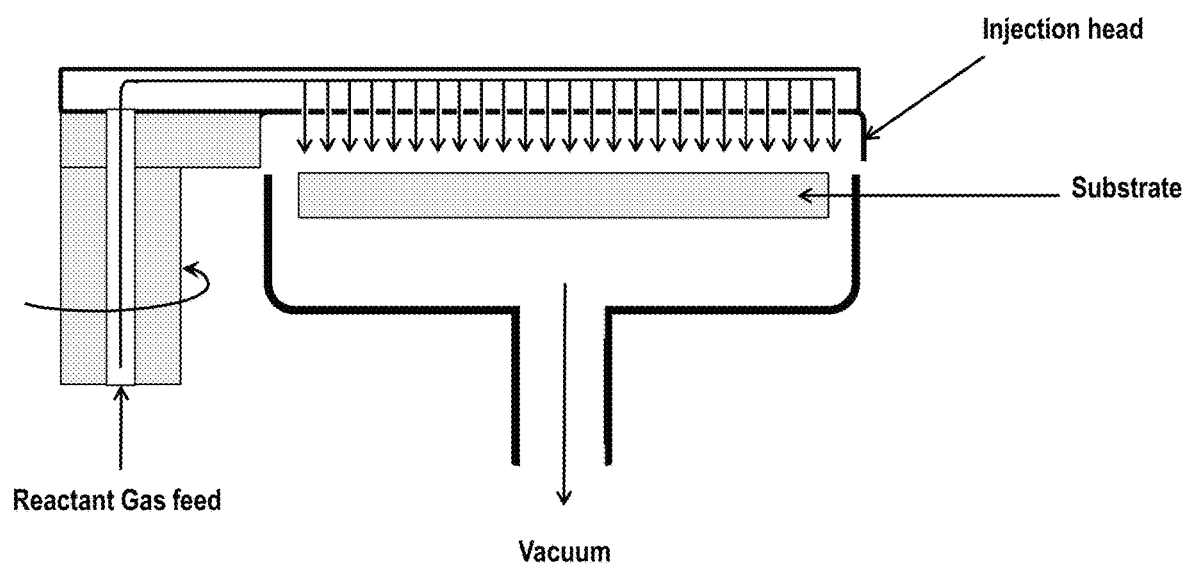
FIGS. 4H and 4I present cross-sectional side views of the injection heads shown in FIGS. 4F and 4G.
Figure 4I:
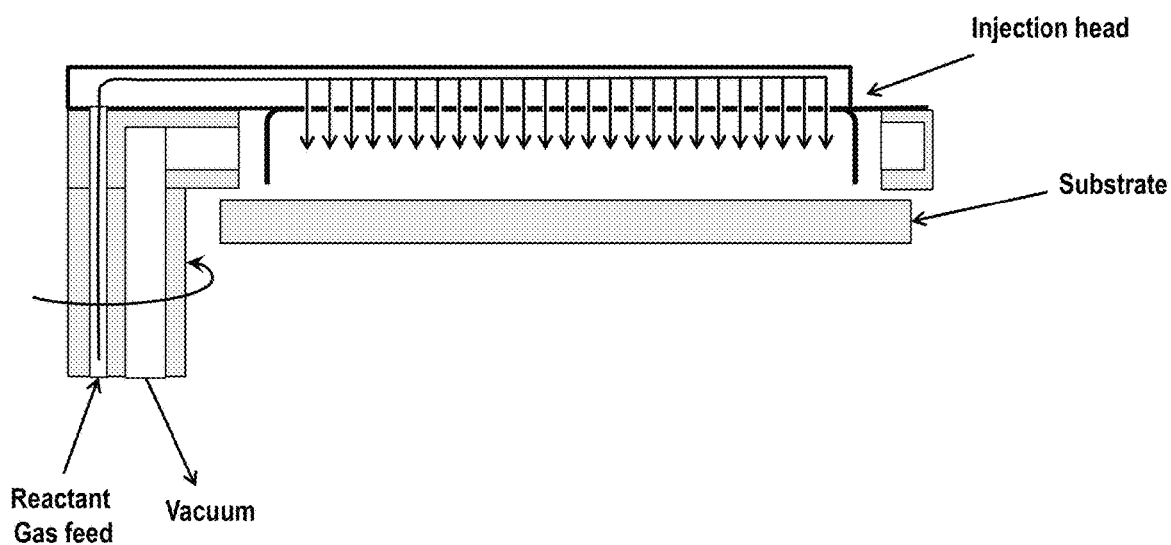

FIG. 4F presents an embodiment of an injection head that can cover 100% or more of the substrate area. The injection head shown in FIG. 4F is circular=, but could be any shape provided it covers all of the substrate surface. In some cases the overall shape of the injection head when viewed from above matches the shape of the substrate (e.g., a circular injection head for a circular substrate, as shown in FIG. 4F, a square injection head for a square substrate, etc.). The injection head can then be moved off of the substrate to allow ion exposure on the substrate surface, then moved back over the substrate to expose the substrate to the reactant. This movement may occur through a linear translation or through pivoting (or through a combination of the two). While the injection head is shown to include two halves, these halves may be joined together to form a single unitary injection head. Where the injection head is separated into halves (or other partial components), the halves may split/pivot open as shown in FIG. 4G. Presented in FIG. 4G, the injection head is separated into 2 halves, each of which is on a separate pivot. Here, the injection head is shown in a partially open position. Alternatively the injector head can be divided into any number of sections and pivot points, for example, thirds, quarters, etc. In this embodiment, the various portions of the injection head rotate over the substrate to provide reactant gas at local high pressure, and then rotate away from the substrate to allow ion exposure on the substrate surface. In this example, the high pressure region acts on the entire substrate surface at once. The distance between the substrate surface and the ceiling of the reaction head is maintained relatively small such that the injection head can deliver reactants to a small volume above the substrate surface. Excess reactants are removed at the periphery of the substrate, as shown in FIGS. 4G-4I.

Figure 5:
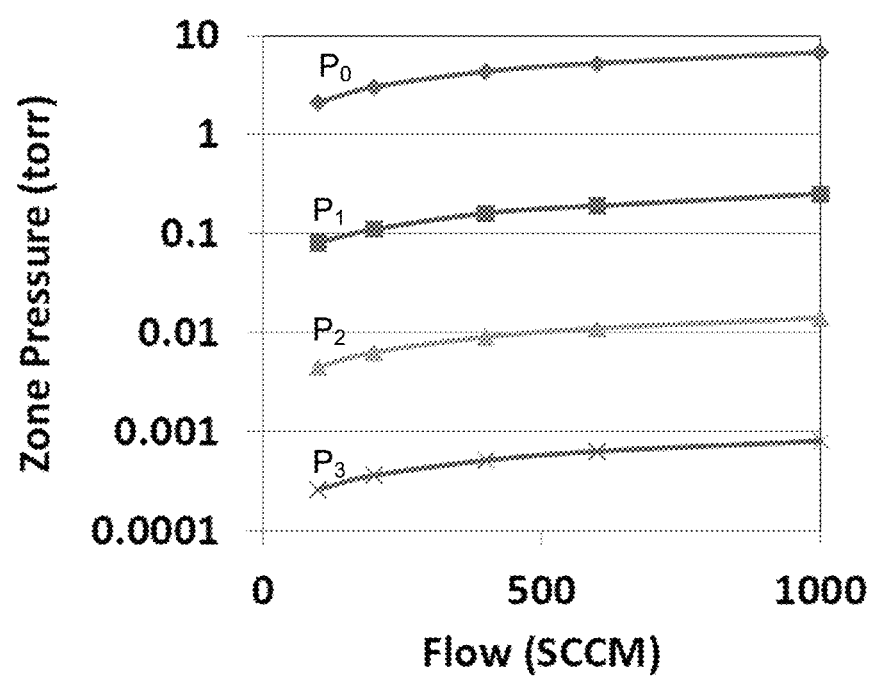
FIG. 5 presents modeling data related to the pressure experienced in each of the different regions of the injection head shown in FIGS. 4A-4C.

FIG. 5 presents computer modeling data related to the injection head shown in FIGS. 4A-4C. In particular, FIG. 5 relates the pressure in each region of the injection head for flow rates between about 0-1000 sccm. The data are modeled assuming that the reactant delivered at high pressure is $N_2$ (larger molecules would result in even greater pressure drops). Further, the data are modeled assuming that $W_0=5$ cm, $W_1=W_2=1$ cm, $L_1=L_2=L_3=1$ cm, $h=1$ cm, and $g=1$ mm. The molecular/transition flow was calculated using slit conduction approximations based on the description in "A low conductance optical slit for windowless vacuum ultraviolet light sources" by R. A. George et al., Journal of Physics E: Scientific Instruments, Volume 4, Number 5 (1971).

For any given flow rate modeled in FIG. 5, the pressure drops by more than an order of magnitude between adjacent regions of the injection head. As a result, the pressure drops from about 2 Torr at $P_0$ to about 0.00025 Torr at $P_3$, which represents an overall decrease of about 99.9875%. Another way to characterize the results is that the pressure drops by a factor of about 8,000 in this example.

Similar modeling simulations were run for injection heads having different dimensions. While the dimensions affected the degree of pressure drop, each case showed a considerable reduction of pressure between adjacent regions. Larger $L_1$, $L_2$ and $L_3$ dimensions (thickness of the dividers $D_1$-$D_3$) result in larger pressure drops. Similarly, smaller g distances between the bottom of the dividers $D_1$-$D_3$ and the substrate surface result in larger pressure drops. Various other modifications may be made to affect the degree of pressure drop experienced in the injection head.

Another advantage provided by the injection head is the ability to perform atomic layer etching. Atomic layer etching represents a process whereby a controlled amount of material is removed each pass in a multi-pass process wherein one of the processes is fully or partially self-limiting. Atomic layer removal processes are further discussed in the following patents and patent applications, each of which is herein incorporated by reference in its entirety: U.S. Pat. Nos. 8,608,973, 8,617,411, and PCT Patent Application No. PCT/US2012/046137. In one embodiment, the scanning injection head generates a localized adsorption of a reactive chemical on a substrate surface that is subsequently removed by the ion beam once the head is moved away from the localized area. In a second embodiment, the ion beam generates a reactive surface that reacts with reactant chemicals in the head once the injection head is scanned over the reactive surface.

As mentioned above, the injection head moves over the surface of the wafer to deliver reactant gases. Ions may or may not be actively impacting the surface of the wafer while the injection head delivers reactant gases, depending on the particular embodiment. A robot arm or other movable mechanical support may be used to hold and move the injection head over the wafer surface. The robot arm may move the injection head over the surface in a single dimension or in two dimensions, and may be an articulating robot arm. Movement of the injection head with respect to the substrate surface may be accomplished by moving the injection head, moving (e.g., rotating) the wafer, or through a combination of such movements. The robot arm may also move the injection head in a third dimension (lifting it away from the substrate support), for example when a wafer is being loaded or unloaded. In some embodiments, the vacuum connection and/or reactant delivery connections are integrated into the robot arm or other mechanical support. In other cases, the vacuum connection and/or reactant gas connections and robot arm are separate. Like the injection head, the robot arm may be coated with a sputter resistant coating. In some implementations, the robot arm or other scanning mechanism used to support the injection head is permanently mounted on a portion of the reaction chamber (e.g., attached to the reaction chamber sidewall). In other implementations, the robot arm or other scanning mechanism may be mounted on a track that allows the arm to easily move around the circumference of the wafer. In either case, the robot arm or scanning mechanism may include connections/joints/points of movement to allow the injection head to move over the surface as desired.

Figure 6A:
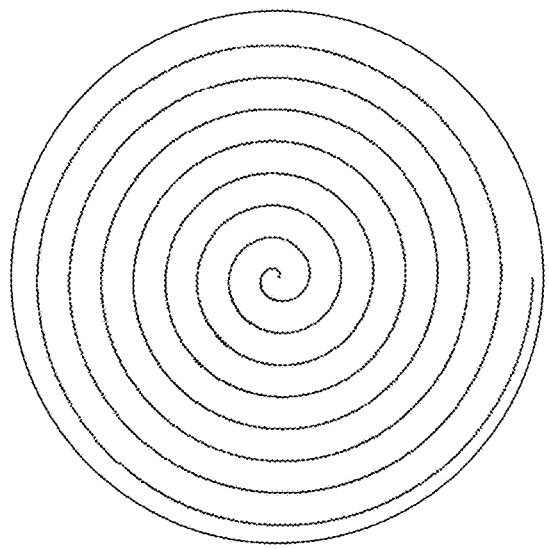
FIGS. 6A-6I illustrate certain example paths and movements that may be traced by an injection head as it moves with respect to a substrate surface.
Figure 6B:
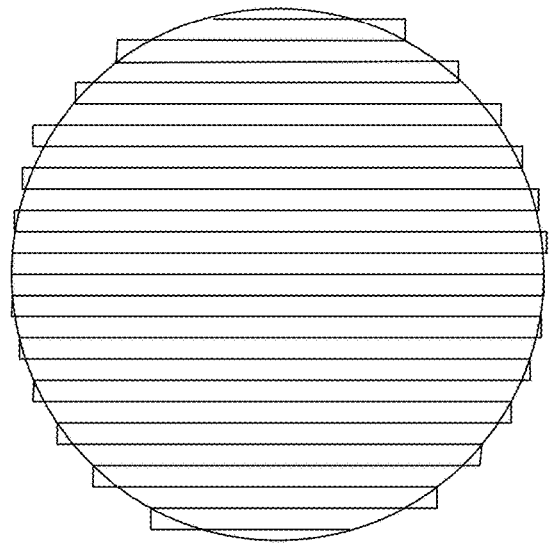
Figure 6C:
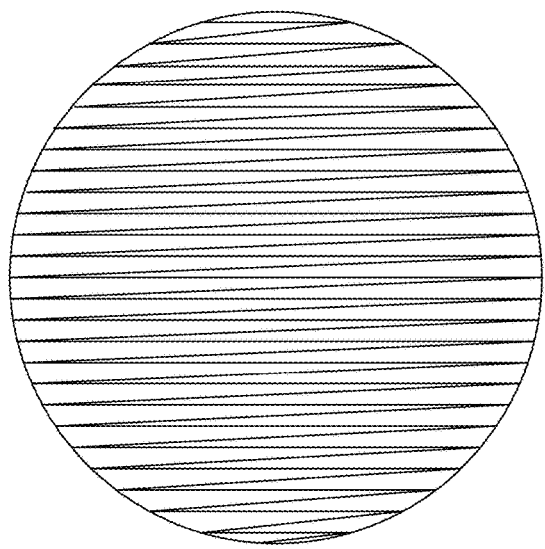
Figure 6D:
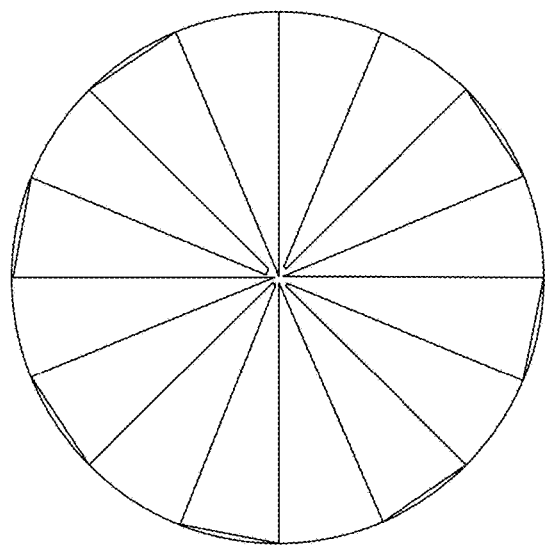
Figure 6E:
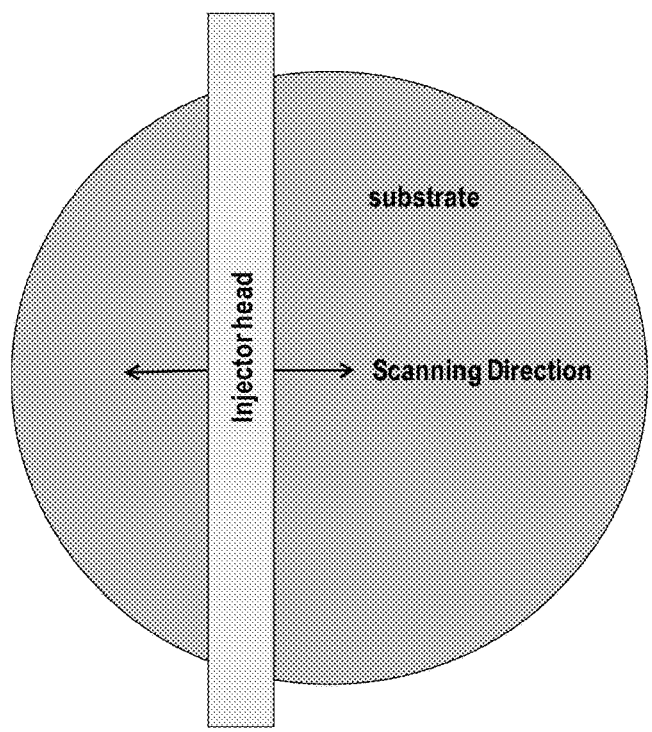
Figure 6F:
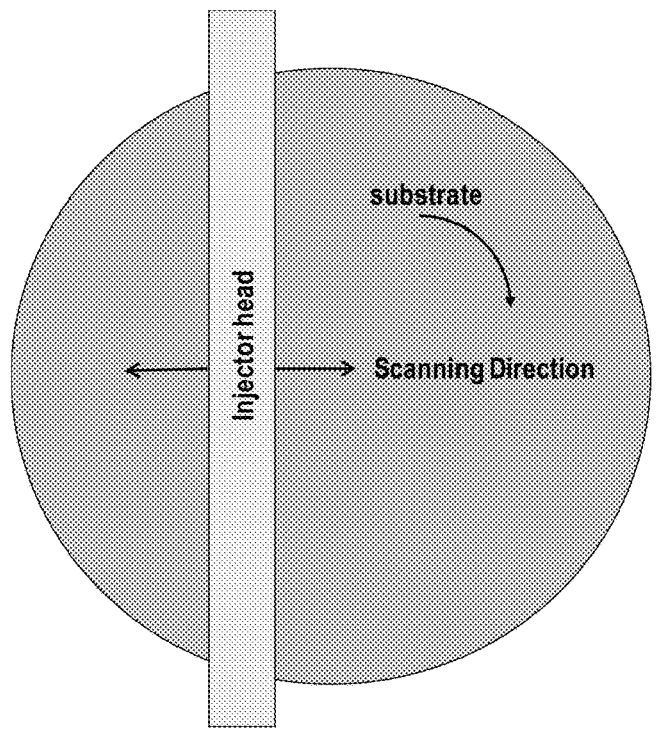
Figure 6G:
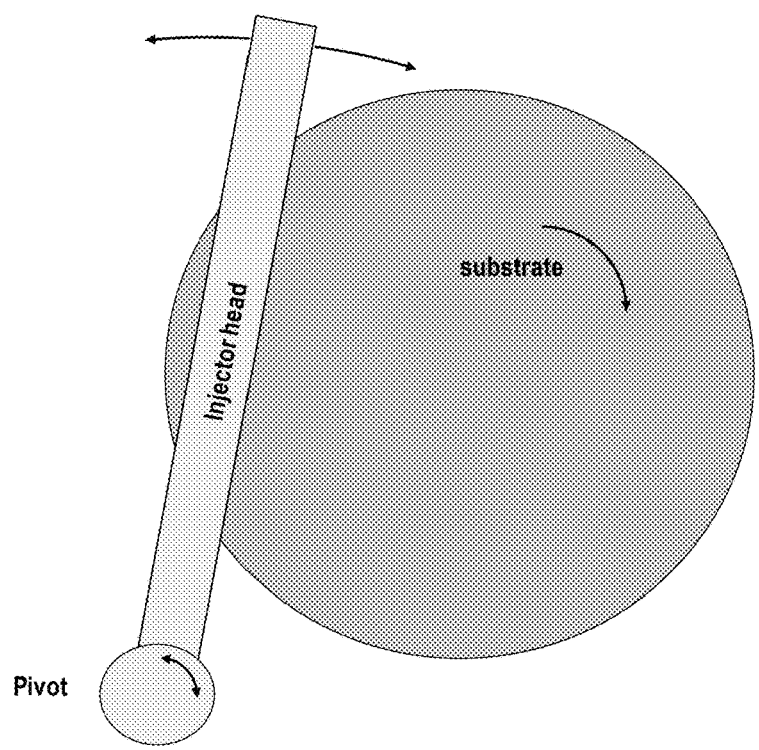
Figure 6H:
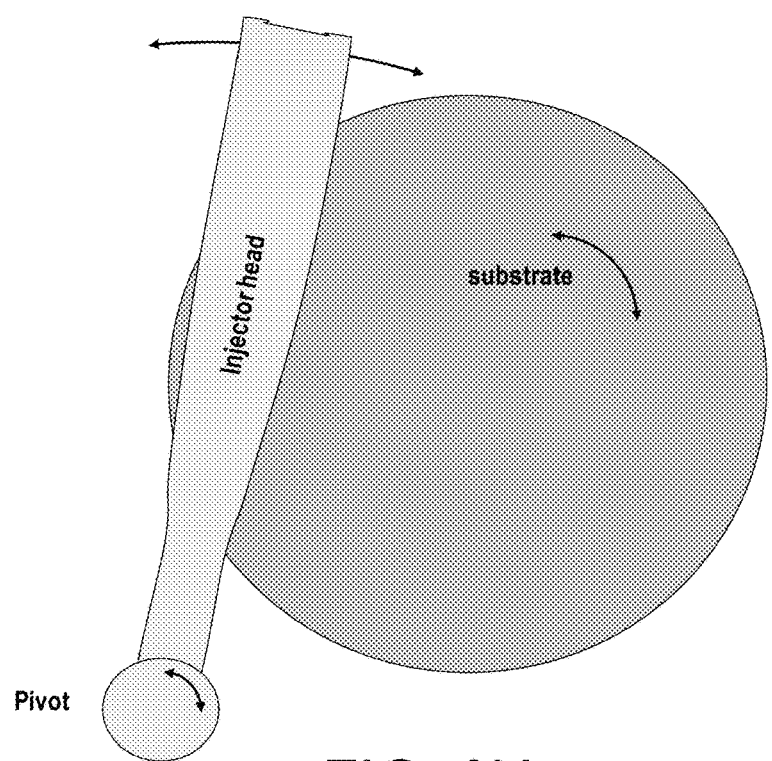
Figure 6I:
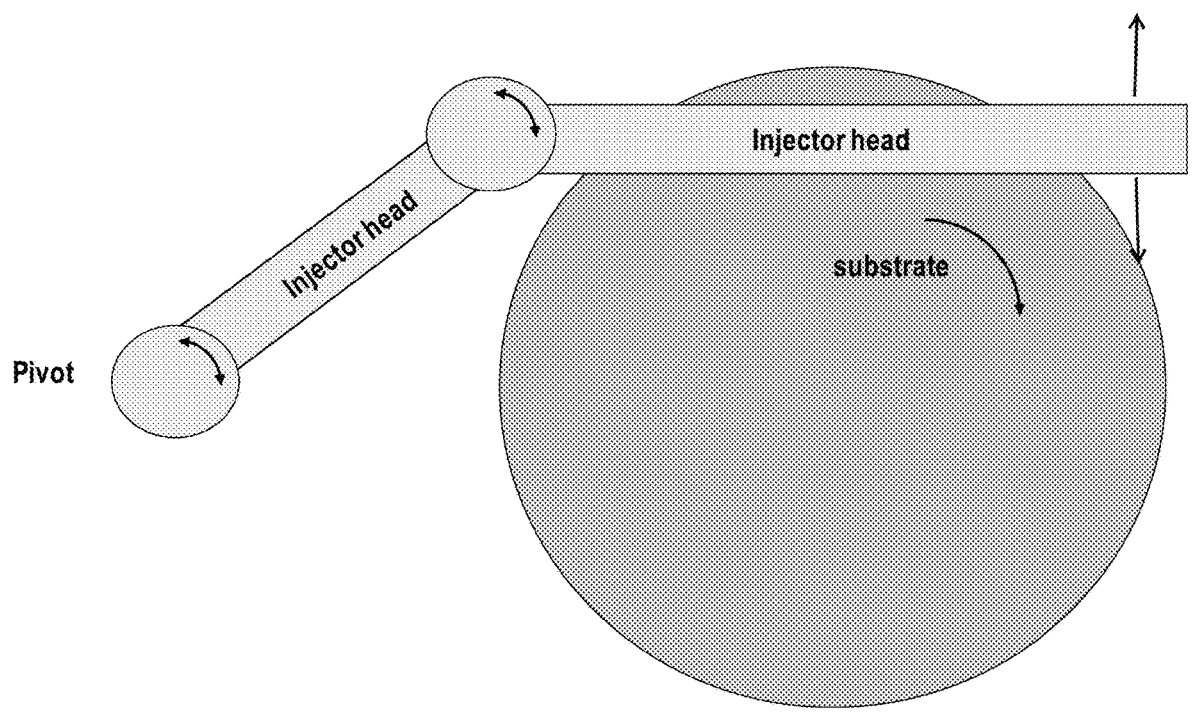

In certain embodiments, the injection head is long and narrow, as shown in FIG. 6E, for example. In various cases, the long length of the injection head extends the full length/diameter of the substrate, and the narrow width of the injection head extends a fraction of the substrate width, as shown. In this embodiment the injection head is scanned back and forth in the direction perpendicular to the long axis of the injection head so as to fully cover the substrate during each pass as shown in (e.g., in FIG. 6E the injection head scans left and right). In these or other cases, the injection head may have a length that is greater than or equal to the substrate physical length (e.g., equal to or greater than about 200 mm, 300 mm, or 450 mm in many cases). In various embodiments the injection head has a length that is between about 1 to 10 cm longer than the substrate length. The injection head may have a width that is between about 1 to 15 cm, for example between about 2 to 5 cm. The scanning of the head may be accomplished using a linear actuator, such movement shown in FIG. 6E or using or one more pivot point, as shown in FIGS. 6G and 6H. The substrate may also be rotated under the injection head, as shown in FIGS. 6F-6I. In certain embodiments, the injection head width may be varied to compensate for scan speed or other variations that may occur, for example, in a single pivot head configuration. An example of an injection head having variable width is shown in FIG. 6H. Alternatively additional pivot points may also be used. In the case of 2 pivot heads, as shown in FIG. 6I, the injector head can be scanned linearly across the substrate.

Two different but related uniformity considerations are important with regard to the injection head. First, reactant gas delivery flux (mass/unit area) through the injection head should be uniform over the face of the wafer when averaged over time during an etching process. Second, ion delivery flux from the ion source should be uniform over the face of the wafer when averaged over time. When the injection head/robot arm/vacuum connection blocks the line of sight between the ion source and a local portion of the wafer, such local portion of the wafer is not impacted by the ions. As such, the injection head, robot arm, and vacuum connection may be configured to provide delivery of reactant gases as well as ions in a spatially uniform manner when averaged over time.

Various scanning patterns may be used to move the injection head over the surface of the substrate to achieve such spatially uniform reactant gas/ion delivery. FIGS. 6A-6I present example scanning patterns that may be used in some embodiments. FIGS. 6A-6D present various tracks that an injection head may take over the surface of a substrate. These scanning patterns may be particularly relevant where the injection head has a geometry that involves movement in two dimensions to cover the entire substrate surface. In some cases, an X-Y stage may be used to move the injection head over the substrate. FIGS. 6E-6F depict elongated scanning injection heads and their movement over the surface of a substrate in various embodiments. Because the injection heads in these cases are at least as long as the substrate diameter, the movement over the substrate is relatively simple.

FIG. 6A shows a spiral scanning pattern, FIGS. 6B and 6C show line-by-line linear patterns, and FIG. 6D shows a radial pattern. Other patterns may be used as well. In some cases, the pattern is configured such that the local high pressure region reaches all or substantially all the wafer. A portion of the local high pressure region and/or a portion of the pressure drop regions may cross over the edge of the wafer in certain patterns, as shown in FIG. 6B. In other cases, the pattern may be designed to place the local high pressure region and/or the pressure drop regions entirely within the edge of the wafer at all times, as shown in FIG. 6A. The injection head may move in straight lines, curves, spirals, etc. The injection head may move along a radius of the wafer, as shown in FIG. 6D. In some embodiments, orbital movements are used. In FIG. 6E, an elongated injection head having a rectangular/slit shaped cross section when viewed from above is scanned back and forth in a direction perpendicular to the elongation length. In FIG. 6F, an elongated injection head is scanned back and forth in a direction perpendicular to the elongation length and the substrate is rotated. In FIGS. 6G and 6H, the elongated injection head is pivoted about a fixed pivot point to scan back and forth over the substrate, with or without substrate rotation. In FIG. 6I, the use of two pivot points allows the injection head to scan linearly over the substrate surface without using a dedicated linear actuator.

In some cases, it may be beneficial to deliver reactants in a spatially non-uniform way when averaged over time. Spatially non-uniform reactant delivery may be used to combat other spatial non-uniformities that arise in a process. For instance, if spatially uniform reactant delivery results in over-etching the center of the substrate and under-etching the edges of the substrate, additional etchant gas or other process gas may be provided to the edges of the substrate compared to the center, to thereby balance out the process and provide spatially uniform results. Related issues such as non-uniformities in the ion beam or processing tool may similarly be compensated for with non-uniform reactant delivery (e.g., by adjusting the etchant rate/flow/pressure/scanning speed, etc. over different parts of the substrate and/or during different portions of the etching process). Further, non-uniform reactant delivery and non-uniform etching results may be beneficial in compensating for previous spatial non-uniformities arising from other processes. For instance, a previous processing step may introduce a systemic error (or non-systemic error if such error is pre-measured and quantified) such as a variation in mask width (line width error) or a variation in film thickness. Where such error/spatial non-uniformity is known, the etching process can be configured to compensate for the non-uniformity.

Another reason that non-uniform reactant delivery and non-uniform etching may be beneficial relates to process development and tuning. For instance, non-uniform reactant delivery may be used to perform multiple experiments on a single substrate. The reactant delivery conditions may be adjusted independently on different parts of the substrate (e.g., delivering reactants at different flow rates and/or different pressures and/or different scanning speeds to different parts of the wafer), and the results may be observed and compared. This technique may reduce the number of substrates needed to test various reaction conditions.

A further benefit that may arise from non-uniform reactant delivery and non-uniform etching relates to forming particular features/shapes while etching. For instance, it may be desirable to etch a line having a different profile on each side (e.g., a vertical profile on a first side and a sloped profile on the other side). In order to accomplish this etching shape, a variable flow rate of reactant may be used. A first flow rate may be used while the substrate is tilted in a first direction, and a second flow rate may be used while the substrate is tilted in a second direction (e.g., the second direction may be opposite the first direction). This asymmetrical etching technique may be used to etch features having non-uniform profiles.

The linear speed at which the injection head moves may be between about 0-500 cm/s, for example between about 1-100 cm/sec, or between about 5-100 cm/sec. Where different portions of the injection head move at different speeds (e.g., in the embodiments shown in FIGS. 6G and 6H), the speeds listed above may correspond to the fastest-moving portion of the injection head. The injection head may scan over the entire surface of the wafer at least once within a time period between about 0.5-10 s. The substrate rotation rate may be between about 0 and 500 RPM, for example between about 0 and 10 RPM. In some cases the linear or angular speed is constant, while in other cases the speed is variable. Variable speed may be helpful in designing patterns that provide spatial uniformity over time. For example, in patterns where the injection head covers certain parts of the wafer more often (e.g., in FIG. 6D the center of the substrate is affected by the injection head more often than each outer portion of the wafer), the injection head may scan over such high frequency portions at a greater speed than other portions. In this way, less material is delivered to that portion of the substrate in each instance, and the total gas delivery is more spatially uniform overall. In some embodiments, the reactant delivery rate varies as a function of position on the substrate surface. For example, a higher delivery rate may be employed in regions where the head moves fastest. In another example, reactant delivery uniformity is achieved by moving the injection head at a constant linear and/or angular speed, and using a higher rate of reactant delivery when the injection head is acting on portions of the wafer that are covered by the injection head less often (e.g., if the injection head moves inward and outward along the radius of the substrate while the substrate rotates, a controller may use an oscillating delivery rate that is higher toward the edge of the substrate and lower toward the center of the substrate, since the center area is contacted more frequently than any given edge area).

In certain cases where an elongated injection head is used (e.g., FIGS. 6E-6I), the length of the head may be divided into zones/segments. Each zone may have an independent reactant supply pressure or suction conductance thereby allowing control of the amount of reactant and pressure of the reactant across the substrate surface. Adjustment of the flow rate, pressure and conductance difference between zones may be static or dynamic. In the case of dynamic adjustment, each zone may have independent reactant supply control through, for example, independent mass flow controllers, variable orifices. Alternatively or in addition, each zone may have independent vacuum pumping through, for example, a set of butterfly valves. In certain embodiments the zones along the length of an elongated injection head have both independent vacuum pumping and reactant injection capability. FIG. 4D shows a top view and side view of an injection head 450 having a plurality of independently controllable gas injectors 477, each fed by an independently controllable gas delivery line 478. For ease of illustration, the gas delivery lines 478 are not shown in the top view. Though not shown, the gas delivery lines 478 may be covered by a housing that may be integral with the injection head 450. FIG. 4E shows a top view and side view of an injection head 460 having independently controllable vacuum regions 461. The vacuum pressure in each of the vacuum regions 461 may be independently controlled. The various vacuum regions 461 are divided by dividers 462, which in some cases may have any of the divider dimensions listed above with respect to FIGS. 4A-4C.

While the injection head has thus far been described as a mobile injection head that moves over the surface of a static substrate, other designs are possible. For example, in some embodiments the wafer moves under the injection head. Such wafer movement may be instead of or in addition to movement of the injection head. The substrate support mechanism in such cases may be configured to rotate and/or translate the wafer. The wafer may rotate at a speed between about 0-200 RPM. Orbital processing may be accomplished using concerted motion of both the substrate and the injection head.

In some processes, it may be beneficial to deliver more than one gaseous reactant at a local high pressure. A number of different techniques may be used to deliver more than one reactant. In one example, the injection head is configured as described above (e.g., with respect to FIG. 4A), and the two or more reactants are mixed before or as they are delivered to the local high pressure region. In another example, a multiple injection heads are provided to deliver each individual reactant. The multiple injection head embodiment may be particularly useful where the reactant gases are expected to deleteriously react with one another, or where it is desired that the reactants be delivered in a sequential manner. In another example, a single modified injection head is used to separately provide each reactant.

Figure 7A:
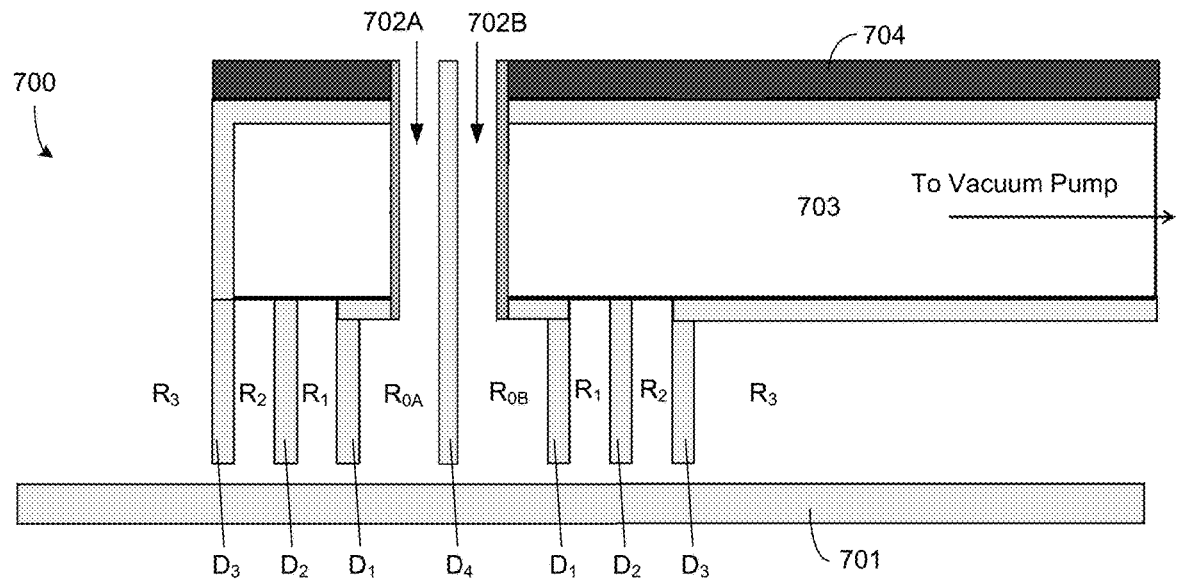
FIGS. 7A and 7B depict injection heads that separately deliver multiple reactant gases at local high pressures according to certain embodiments.

A modified injection head may take various forms. FIG. 7A presents one example of an injection head 700 that may be used to separately deliver a number of reactants. The injection head 700 of FIG. 7A is similar to the injection head 400 of FIG. 4A. However, the injection head 700 of FIG. 7A includes two inlets 702A and 702B for separately delivering reactant A and reactant B to the wafer 701. The two inlets 702A and 702B are separated by a divider $D_4$, which cuts the local high pressure region into two local high pressure regions $R_{OA}$ and $R_{OB}$. Reactant A is delivered at a high pressure in the first local high pressure region $R_{OA}$, and reactant B is delivered at a high pressure in the second local high pressure region $R_{OB}$. As shown, each local high pressure region $R_{OA}$ and $R_{OB}$ may have the same amount of area exposed substrate surface. However, the divider $D_4$ may be positioned off-center to thereby allow different reactant areas over the substrate (in other words, $R_{OA}$ and $R_{OB}$ may have different sizes). In one embodiment, the local high pressure regions $R_{OA}$ and $R_{OB}$ have substantially semi-circular cross sections when viewed from above, and the pressure drop regions $R_1$-$R_2$ have substantially annular cross sections when viewed from above. In another embodiment, $R_{OA}$, $R_{OB}$, and $R_1$-$R_2$ each have elongated cross-sections, for example substantially rectangular cross sections, when viewed from above. In such a case, the various regions may extend into and out of the page in FIG. 7A. Where this is the case, it may be beneficial to design the reactant delivery lines and vacuum connection such that they are in-line with the various elongated sections of the injection head. In such a design, the arrow pointing to the vacuum pump may extend into or out of the page, along the length of the injection head, rather than off to the right, as shown.

Reactant A and reactant B may be provided at the same local high pressure, or at different pressures. Excess reactants are removed in the pressure drop regions $R_1$ and $R_2$. In another embodiment, reactant B is provided via a reactant delivery region that substantially surrounds the reactant delivery region of reactant A. For example, the reactant delivery region of reactant B may fully encircle that of the reactant delivery region for reactant A.

While reactants A and B are provided separately, they may mix with one another to some degree in the pressure drop regions $R_1$ and $R_2$. The mixing may be minimized by dividing the pressure drop regions into different angular portions. For instance, the pressure drop regions may each be divided into two sub-regions, a first sub-region that is proximate the first local high pressure zone $R_{OA}$ and a second sub-region that is proximate the second local high pressure zone $R_{OB}$. The first sub-region may primarily remove excess reactant A and the second sub-region may primarily remove excess reactant B. Of course, additional angularly distinct sub-regions may be used to further minimize mixing of the reactants. If mixing of the reactants within the vacuum connection 703 is a problem, separate vacuum connections may be provided to connect to each distinct portion of the apparatus. This embodiment may be modified to separately provide any number of reactants at different pressures, simply by changing the shape of the inlets and the divider separating the inlets. In one example, the divider $D_4$ has a cross-shaped cross section when viewed from above, each quadrant of the cross being configured as an inlet to provide one of four different reactants.

Figure 7B:
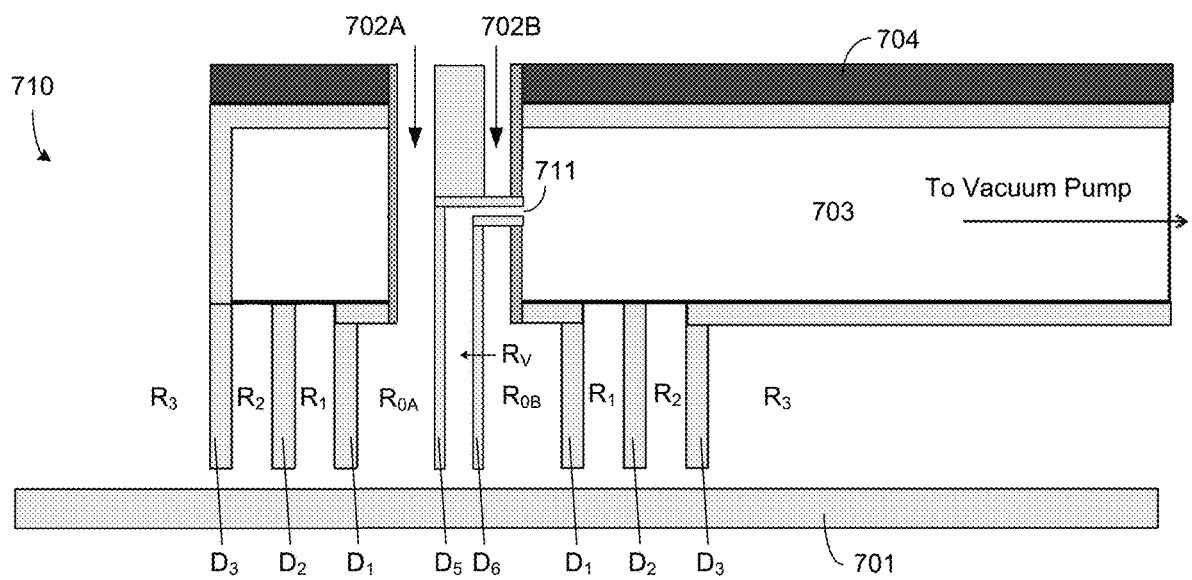

FIG. 7B presents an additional embodiment of an injection head 710 that may be used to separately deliver two different reactants A and B. Like the embodiment of FIG. 7A, the high pressure region is split into a first local high pressure region $R_{OA}$ for delivering reactant A, and a second local high pressure region $R_{OB}$ for delivering reactant B. However, FIG. 7B includes an additional central reactant removal region $R_V$ separating the two local high pressure regions $R_{OA}$ and $R_{OB}$. Near the wafer, the central reactant removal region $R_V$ is bounded on one side by divider $D_5$ and on the other side by divider $D_6$ (thus, in this example the portion of $R_V$ near the substrate has a rectangular cross-section when viewed from above). The central reactant removal region $R_V$ is connected with the vacuum pump through connection 711 to remove excess reactants and help prevent mixing of the reactants as they are actively adsorbing onto or otherwise contacting the surface of the substrate 701. This embodiment may be modified to provide any number of reactants. Moreover, the central reactant removal region $R_V$ may be divided into additional regions to further minimize the likelihood that reactants are able to mix in the gaseous (non-adsorbed) state. Like the embodiment of FIG. 7A, the injection head in the embodiment of FIG. 7B may have a substantially circular cross section or an elongated, substantially rectangular cross-section when viewed from above. Where the injection head is substantially circular, the pressure drop regions $R_1$ and $R_2$ may be annularly shaped, as viewed from above. Where the injection head is elongated, the pressure drop regions $R_1$ and $R_2$ may also be elongated, extending along the length of the entire injection head, with the $R_1$ regions abutting the entire length of the local high pressure regions $R_{OA}$ and $R_{OB}$, and the $R_2$ regions abutting the entire length of the $R_1$ regions.

As mentioned above, another way to separately provide two or more reactants is to use two or more injection heads. The two or more injection heads may be completely separate, or they may share one or more components such as the vacuum connection, robot arm, etc. Further, two or more injection heads may be used to separately provide reactants to different parts of the wafer, even where both injection heads deliver the same reactant gas.

The disclosed embodiments may be used to deliver any gas phase reactant at a local high pressure to the surface of a substrate. In some embodiments, the gas phase reactant delivered by the injection head comprises one or more of oxidizers, halogenators, reducing agents, complexing agents, acids, bases, alcohols, ketones, aldehydes, or esters or any combination thereof. Examples include but are not limited to: $H_2O$, $H_2O_2$, $NO_2$, $NO$, $N_2O$, $CF_4$, $C_2F_6$, $CHF_3$, $SF_6$, $HF$, $HCl$, $HI$, $HNO_3$, $Cl_2$, $CClF_3$, $CCl_2F_2$, $HBr$, $Br_2$, $F_2$, $H_2$, $NH_3$, methanol, ethanol, isopropanol, acetic acid, formic acid, carboxylic acid, acetone, methylethyl ketone, acetyl acetone (acac), hydrofluoro acetone (hfac), formaldehyde, and butyl acetate, and any combination thereof. Further, any source and type of ions may be used. The ions may be inert, reactive, non-reactive or a combination of inert reactive and non-reactive ions. Example inert ions include noble gases such as argon, helium, neon, krypton, xenon, etc. Example reactive ions include nitrogen, hydrogen, oxygen, fluorine, bromine, iodine, sulfur, etc. Example of non-reactive ions include: nitrogen, silicon, carbon, germanium, boron, and aluminum. Inert ions may be particularly suitable for etching non-volatile materials, for example in processes involved in fabricating MRAM and FeRAM devices. On the other hand, reactive ions may be especially suitable for etching semiconductor materials, which may involve processes for fabricating logic and memory devices.

In some embodiments, the flow of the gas used to generate the ions is between about 0.1-1000 sccm. In these or other embodiments, the flow of reactant gas through the injection head is between about 0.1-5000 sccm, for example between about 10-500 sccm. Reactants may be provided to a local high pressure region of an injection head at a pressure between about 0.1-100 Torr, for example between about 1-50 Torr in some cases. In the example related above with respect to FIGS. 2A-2C where oxygen ions act to oxidize a metal surface and a reactive gas (e.g., acetic acid) is used to remove the oxidized metal, the flow rate of acetic may be between about 10 sccm-500 sccm, and the oxygen ion current density may be between about 0.1-20 $mA/cm^2$.

In some embodiments the injection head may be heated or cooled. Heated injector heads may be needed for injecting reactant vapors (to prevent condensation of the reactant) or for providing some thermal energy to effect the surface reaction on the substrate. In other embodiments, the injector head may be cooled to promote surface adsorption of the reactant on the substrate.

The injection head may optionally contain one or more diagnostic elements or end point detectors integrated into head or connected to the head. The detectors or diagnostic elements may be placed in the local high pressure zone, in one or more of the intermediate pressure zones, in the vacuum exhaust region, or outside but adjacent to the head. Diagnostic or endpoint detectors can include: residual gas analysis, FTIR spectrometers, ellipsometry, extinction coefficient measurement, or other optical film thickness measurement device, atomic absorption spectrometers, optical emission spectrometers, ion induced illuminescence spectrometers, faraday cups, interferometers, quartz crystal microbalances, AFM probes, magnetic field sensors, eddy current sensors, dielectric-resonators or other contactless sheet resistance sensors.

While the embodiments have been described in the context of a reactive ion beam etching process, they are not so limited. It is expected that the disclosed injection head will be useful in any application that involves delivering one or more high pressure reactants to a surface in a local manner where it is desired that the overall pressure (outside the injection head) remains low.

The apparatus used for performing the disclosed embodiments often includes a system controller having programming to control the etching process. The controller may execute system control software, which may be stored in a mass storage device, loaded into a memory device, and executed on a processor. The software may be transferred over a network in some cases. Various process tool component subroutines or control objects may be written to control operation of the process tool components necessary to carry out various process tool processes. The system control software may be coded in any suitable computer readable programming language. In some embodiments, the system control software may include input/output control (IOC) sequencing instructions for controlling the various parameters discussed herein. The system controller may also be associated with other computer software and/or programs, which may be stored on a mass storage device or memory device associated with the controller. Examples of programs or sections of programs for this purpose include a substrate positioning program, a plasma gas control program, a reactant gas control program, a pressure control program, a temperature control program, and a plasma control program.

A substrate positioning program may include code for process tool components that are used to load and unload the substrate onto the substrate support, and to control the spacing between the substrate and other parts of the processing apparatus such as the injection head. A plasma gas control program may include code for controlling the composition and flow rates of gas(es) used to generate the plasma from which ions are extracted. A reactant gas control program may include code for controlling the composition, flow rate, and pressure at which reactant gases are delivered through the injection head (or to/through other portions of the apparatus). A pressure control program may include code for controlling the pressure at which individual reactants are delivered, the pressure at which reactants are removed, and the pressure at which the substrate processing region is maintained. A temperature control program may include code for controlling heating and/or cooling equipment used to maintain the substrate, substrate support, and/or substrate processing region at a particular temperature. A plasma control program may include code for generating the plasma at certain powers and frequencies.

The system control software may include instructions for delivering reactants at the flow rates and/or pressures disclosed herein. Such instructions may relate to delivery of a gas used to generate plasma (from which ions are extracted), or they may relate to delivery of one or more gases through the one or more injection heads. The system control software may also include instructions for removing excess reactants at a certain vacuum pressure. Further, the system control software may include instructions related to movement of the injection head with respect to the substrate. For instance, the instructions may relate to moving the injection head, moving the substrate, or both. In various cases the system control software includes instructions to move the injection head with respect to the substrate in a manner that delivers reactants in a spatially uniform manner when averaged over time. The instructions may also relate to any operations needed to load and unload the substrate.

The system control software may further include instructions for maintaining the substrate processing region at a certain pressure, for example any of the low pressures listed herein. The system control software also typically includes instructions for controlling the timing of the etching process. In many cases the controller also controls the bias applied to each of the electrodes. As such, the system control software may include instructions for applying a first bias to the extraction electrode, a second bias to the focus electrode, and a third bias (or ground conditions) to the lower electrode and substrate/substrate support. In some embodiments, the instructions further include maintaining the substrate and/or substrate processing region at a particular temperature through heating or cooling.

Where a shutter is used to modulate ion flux, the system control software may include instructions to modulate the ions by opening and closing the shutter at desired times. In a particular embodiment, the software includes instructions to open the shutters (thereby allowing ions to impinge on the wafer surface) only when the injection head is not actively present on the surface. In a related embodiment, the software includes instructions to maintain certain shutters open and certain shutters closed, the closed shutters being those that would otherwise allow ions to impinge on the injection head, and the open shutters being those that allow ions to impinge directly on the wafer surface (i.e., ions are allowed to hit the substrate surface but not the injection head).

With respect to plasma generation, the system control software may include instructions for providing a plasma generation gas at a particular flow rate, temperature, and/or pressure. The instructions may further relate to the amount of power (e.g., RF power) used to generate the plasma, and the frequency at which such power is delivered.

In some embodiments, a user interface may be associated with a system controller, the user interface may include a display screen, graphical software displays of the apparatus and/or process conditions, and user input devices such as pointing devices, keyboards, touch screens, microphones, etc.

In many embodiments, the system controller is used to adjust other process parameters. Such parameters may include, but are not limited to, reactant gas compositions, flow rates, and pressures, plasma generation gas composition, flow rates, and pressures, pressure in the substrate processing region, bias applied to the individual electrodes, temperature, plasma conditions (e.g., frequency and power), position of the wafer and/or injection head, etc.

Signals for monitoring the process may be provided by analog and/or digital input connections of the system controller from various process tool sensors. The signals for controlling the process may be output on the analog and digital output connections of the controller. Non-limiting examples of process tool sensors that may be monitored include mass flow controllers, pressure sensors, thermocouples, etc. Appropriately programmed feedback and control algorithms may be used with data from these sensors to maintain process conditions. In certain embodiments, a distance sensor may be used to provide feedback for controlling the distance between the substrate and the injection head.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. An injection head for providing reactants to a surface of a substrate, the injection head comprising:
   a substrate-facing region comprising:
     (i) a first reactant outlet region of a first reactant delivery conduit, and
     (ii) a first suction region configured to be coupled to a first vacuum conduit; and
   a housing covering the first reactant delivery conduit and the first vacuum conduit, wherein the housing includes an upper surface positioned opposite the substrate-facing region, wherein the upper surface is coated with a sputter-resistant material.

2. The injection head of claim 1, wherein the sputter-resistant material comprises amorphous carbon.

3. The injection head of claim 1, wherein the sputter-resistant material comprises silicon.

4. The injection head of claim 1, wherein the sputter-resistant material comprises silicon oxide.

5. The injection head of claim 1, wherein the sputter-resistant material comprises aluminum.

6. The injection head of claim 1, wherein the sputter-resistant material comprises aluminum oxide.

7. The injection head of claim 1, the substrate-facing region further comprising a second reactant outlet region of a second reactant delivery conduit.

8. The injection head of claim 7, wherein the first reactant outlet region delivers a first reactant to the surface of the substrate and the second reactant outlet region delivers a second reactant to the surface of the substrate, the first and second reactants being different from one another.

9. The injection head of claim 1, further comprising a heater that heats the injection head.

10. The injection head of claim 1, further comprising a cooling element that cools the injection head.

11. The injection head of claim 1, further comprising a movement mechanism that moves the substrate-facing region of the injection head within a plane parallel to the surface of the substrate.

12. The injection head of claim 11, wherein the movement mechanism comprises a pivot point that allows the substrate-facing region of the injection head to move within the plane.

13. The injection head of claim 12, wherein the injection head has a length and a width, each measured in the plane parallel to the surface of the substrate, wherein the width of the injection head varies along the length of the injection head.

14. The injection head of claim 1, wherein the injection head has a length and a width, each measured in a plane parallel to the surface of the substrate, wherein the width of the injection head varies along the length of the injection head.

15. The injection head of claim 1, wherein the first suction region has a substantially rectangular cross-section.

16. The injection head of claim 1, the substrate-facing region further comprising a second reactant outlet region of either the first reactant delivery conduit or a second reactant delivery conduit, wherein the first suction region substantially surrounds both the first reactant outlet region and the second reactant outlet region.

17. The injection head of claim 1, the substrate-facing region further comprising a second suction region configured to be coupled to the first vacuum conduit or a second vacuum conduit, wherein the first suction region substantially surrounds the first reactant outlet region, and wherein the second suction region substantially surrounds the first suction region.

18. The injection head of claim 17, the substrate-facing region further comprising a third suction region configured to be coupled to the first vacuum conduit, the second vacuum conduit, or a third vacuum conduit, wherein the third suction region substantially surrounds the second suction region.

19. The injection head of claim 1, wherein the injection head comprises a left portion and a right portion, the left and right portions each comprising a shape that is approximately semicircular, wherein each of the left and right portions is configured to pivot open and closed, wherein the left and right portions together form a shape that is approximately circular when they are closed together.

* * * * *